(12) United States Patent
Nagai et al.

(10) Patent No.: US 8,785,007 B2
(45) Date of Patent: Jul. 22, 2014

(54) PENDANT-TYPE POLYMERIC COMPOUND, COLOR CONVERSION FILM USING PENDANT-TYPE POLYMERIC COMPOUND, AND MULTICOLOR EMISSION ORGANIC EL DEVICE

(75) Inventors: Masaru Nagai, Kawasaki (JP); Mitsuhiro Okada, Tokyo (JP); Koichi Shigeno, Tokyo (JP)

(73) Assignee: Adeka Corporation, Tokyo (JP)

( * ) Notice: Subject to any disclaimer, the term of this patent is extended or adjusted under 35 U.S.C. 154(b) by 303 days.

(21) Appl. No.: 13/496,847

(22) PCT Filed: Sep. 10, 2010

(86) PCT No.: PCT/JP2010/005564
§ 371 (c)(1),
(2), (4) Date: May 31, 2012

(87) PCT Pub. No.: WO2011/033753
PCT Pub. Date: Mar. 24, 2011

(65) Prior Publication Data
US 2012/0229017 A1 Sep. 13, 2012

(30) Foreign Application Priority Data
Sep. 18, 2009 (JP) ................................. 2009-217311

(51) Int. Cl.
*H01L 51/54* (2006.01)

(52) U.S. Cl.
USPC ........... 428/690; 428/917; 313/504; 313/505; 313/506; 257/40; 257/E51.05; 257/E51.026; 257/E51.032; 564/26; 564/426; 564/430; 564/432; 564/434

(58) Field of Classification Search
USPC .................. 428/690, 917; 313/504, 505, 506; 257/40, E51.05, E51.026, E51.032; 564/26, 426, 430, 432, 434
See application file for complete search history.

(56) References Cited

U.S. PATENT DOCUMENTS

| | | | |
|---|---|---|---|
| 5,759,444 A * | 6/1998 | Enokida et al. ........... | 252/301.16 |
| 7,060,783 B2 | 6/2006 | Seki et al. | |
| 7,431,996 B2 | 10/2008 | Iwasaki et al. | |
| 2007/0104977 A1* | 5/2007 | Arakane et al. ............... | 428/690 |
| 2008/0174874 A1 | 7/2008 | Kanaya | |
| 2010/0156284 A1 | 6/2010 | Fukushima et al. | |

FOREIGN PATENT DOCUMENTS

| | | |
|---|---|---|
| JP | 8-053397 A | 2/1996 |
| JP | 10-072579 A | 3/1998 |
| JP | 10-072580 A | 3/1998 |
| JP | 10-072581 A | 3/1998 |
| JP | 2000-026852 A | 1/2000 |
| JP | 2000-230172 A | 8/2000 |
| JP | 2002-075643 A | 3/2002 |

(Continued)

*Primary Examiner* — Gregory Clark
(74) *Attorney, Agent, or Firm* — Venable LLP; Michael A. Sartori

(57) ABSTRACT

The present invention provides green and red conversion films capable of keeping a sufficient intensity of converted light over a long period, and a multicolor emission organic EL device which exhibits light-emitting properties stably over a long period. The present invention includes a pendant-type polymeric compound characterized in that the pendant-type polymeric compound contains at least one repeating unit represented by a general formula (1) and at least one repeating unit represented by a general formula (2), (6) or (7), wherein n/(m+n)=1/100 to 100/100 provided that the molar ratio of (1):(2), (6) or (7) is m:n.

7 Claims, 7 Drawing Sheets

(56) References Cited

FOREIGN PATENT DOCUMENTS

| JP | 2004-196910 A | 7/2004 |
| JP | 2004-362910 A | 12/2004 |
| JP | 2005-053958 A | 3/2005 |
| JP | 2007-157550 A | 6/2007 |
| JP | 2007-162009 A | 6/2007 |
| JP | 2008-133443 A | 6/2008 |
| JP | 2008-181771 A | 8/2008 |
| JP | 2009-023914 A | 2/2009 |
| WO | WO-2008/143272 A1 | 11/2008 |

\* cited by examiner

PENDANT-TYPE POLYMERIC COMPOUND, COLOR CONVERSION FILM USING PENDANT-TYPE POLYMERIC COMPOUND, AND MULTICOLOR EMISSION ORGANIC EL DEVICE

TECHNICAL FIELD

The present invention relates to a pendant-type polymeric compound which fluoresces in the form of a solid thin film is processable by a coating process, and has a high color-conversion efficiency. Moreover, the present invention relates to a color conversion film formed using the pendant-type polymeric compound. Furthermore, the present invention relates to a multicolor emission organic EL device formed using the color conversion film.

BACKGROUND ART

Recently, with the advancement in optical technologies, organic fluorescent compounds have attracted attentions in a wide range of fields such as light-emitting materials for organic electroluminescence, dye lasers, and bioimaging. The organic fluorescent compounds are particularly applicable to a color conversion technique in which light at a desired wavelength is emitted after absorption at a specific wavelength. The practical applications as a light conversion film have been actively studied for various uses in organic electroluminescent displays, solar cells, liquid crystal displays, agricultural films, light-emitting diodes, and so forth.

For example, Patent Literature 1 discloses a diarylamine derivative useful as an organic electroluminescent element or an electrophotographic photoreceptor. Patent Literature 2 discloses a polyester resin useful in an organic electroluminescent element. Further, Patent Literature 3 discloses a diamine compound polymer having condensed aromatic groups and applicable to organic electronic devices. Patent Literature 4 discloses a triarylamine-based polymer and a polymeric light emitting element using the same.

Furthermore, Patent Literature 5 discloses a light-diffusing resin composition containing a dye having a maximum absorption wavelength in a range of 470 nm to 520 nm or 570 nm to 610 nm and a maximum fluorescence wavelength in a range of 380 nm to 470 nm, 520 nm to 570 nm, or 610 nm to 700 nm, and an image display using the composition.

Furthermore, Patent Literature 6 discloses a color converter characterized by being made of a fluorescent substance which absorbs a short wavelength component of incident light and converts the short wavelength component into a long wavelength component for emission, and a plant growing apparatus including the color converter disposed therein. Patent Literature 7 discloses a light conversion film and an image display using an organic fluorescent substance employable in a light-emitting diode.

Researches for practical applications of organic EL elements have been actively conducted. Organic EL elements can achieve a high current density at a low voltage, and thus is expected to achieve high luminance and luminous efficiency. Particularly, the application to multicolor organic EL displays capable of displaying high-definition multiple colors or full color is expected. As one example of a method of creating a multicolor or full-color organic EL display, there is a method using multiple types of color filters each transmitting light in a specific wavelength region (color filter method). When the color filter method is employed, an organic EL element to be used is required to emit beams of multiple colors to thereby emit so-called "white light" containing three primary colors of light (red (R), green (G), blue (B)) in a good balance.

As another method of obtaining a multicolor emission organic EL element, there has been proposed a color conversion method using a single-color emission organic EL element and a color conversion film (see, for example, Patent Literature 8). The color conversion film used therein is a layer containing one or more color conversion substances each of which absorbs light of a short wavelength and converts the light into light of a long wavelength.

When a color conversion film is formed using a single color conversion substance, however, a so-called concentration quenching phenomenon occurs where an absorbed energy is deactivated without emitting light, as the energy is repeatedly transferred between the same molecules. To suppress this phenomenon, a medium dispersion-type color conversion film is proposed in which the concentration of a color conversion substance is lowered by being dissolved or dispersed in a certain medium to thus suppress the contact between molecules of the color conversion substance (see, for example, Patent Literature 9).

To form a color conversion film by a coating process carried out at low cost, the color conversion substance is required to be soluble. Moreover, from the viewpoint of the process, desirably, the viscosity adjustment suitable for a device to be used is easily made. To achieve such a purpose, it is desirable to use a color conversion substance made of a polymeric material which is dissolvable in a wide range of solvents, and which allows easy adjustment of the solution viscosity by changing the molecular weight.

Conventionally, as the color conversion film using a polymeric material, a color conversion film containing a conjugated polymeric material has been proposed. Specifically, there has been proposed a color conversion film containing a polyarylenevinylene derivative (see, for example, Patent Literature 10) or a polyfluorene derivative (see, for example, Patent Literature 11) which are known as light-emitting materials for polymeric EL.

CITATION LIST

Patent Literature

PTL 1: Japanese Patent Laid-Open No. H 08-053397 (1996)
PTL 2: Japanese Patent Laid-Open No. 2004-196910
PTL 3: Japanese Patent Laid-Open No. 2005-53958
PTL 4: Japanese Patent Laid-Open No. 2007-162009
PTL 5: Japanese Patent Laid-Open No. 2008-133443
PTL 6: Japanese Patent Laid-Open No. 2008-181771
PTL 7: Japanese Patent Laid-Open No. 2009-023914
PTL 8: Japanese Patent Laid-Open No. 2002-075643
PTL 9: Japanese Patent Laid-Open No. 2000-230172
PTL 10: Japanese Patent Laid-Open No. 2000-026852
PTL 11: Japanese Patent Laid-Open No. 2004-362910
PTL 12: Japanese Patent Laid-Open No. 2007-157550

SUMMARY OF INVENTION

Technical Problem

However, when the concentration of a color conversion substance is lowered in a medium dispersion-type color conversion film, the absorbance of light to be absorbed is decreased, and a sufficient intensity of converted light is not obtained. Against this problem, the color conversion film is thickened to increase the absorbance, accordingly keeping the color-conversion efficiency. Use of such a thick color conversion film (thickness: approximately 10 μm) brings about the following problems: an occurrence of breakage of an electrode pattern at a stepped portion, difficulty in achieving high-definition, the remaining of moisture or solvent in the film (in the combination with an organic EL element, the residual moisture or solvent modifies the organic EL layer, leading to a display defect), and the like.

Further, in the medium dispersion-type color conversion film as described above, the following phenomenon frequently occurs, as time elapses, that the color conversion substance moves in the medium by diffusion, and molecules thereof aggregate together, consequently leading to concentration quenching. Hence, it is difficult to keep a high color-conversion efficiency in such a color conversion film over a long period.

Accordingly, in order to form a color conversion film capable of keeping a sufficient intensity of converted light over a long period without increasing the thickness, the material is desired to have appropriate absorption and emission spectra and a high fluorescence quantum yield of the material, and cause less concentration quenching when formed into a thin film.

As another method for forming a highly-efficient color conversion film without increasing the thickness, there has been proposed utilization of Förster-type energy transfer between a host and a guest (advanced CCM technique) (see Patent Literature 12). In this method, a color conversion film includes a host material which is excited upon absorption of a backlight (blue), and a guest material which emits light of a desired color upon reception of the excited energy.

The advanced CCM technique is particularly useful in forming a red conversion film. To absorb emitted blue light and emit red light, the color conversion material is required to have a very large Stokes shift. Such a material has a long fluorescence lifetime, increasing the chance of non-luminous deactivation. For this reason, the increase in the fluorescence quantum yield cannot be expected at all. Accordingly, it is quite difficult to achieve red light emission at a high efficiency using a color conversion film made of a single material.

In addition, the fluorescence quantum yield's of the polyarylenevinylene derivative and the polyfluorene derivative in the form of a thin film reported so far are at most approximately 40%. This is insufficient for use as a color conversion film.

Moreover, the color of light emitted from the polyfluorene derivative is blue, and the color of light emitted from the polyarylenevinylene derivative is yellow green to red. These materials cannot be used as a color conversion material for green light emission.

Presumably, these materials may be used as a host material to achieve red light emission. However, the result of the examination showed that the color conversion film obtained by using these conjugated polymeric materials as the host and a low-molecular-weight red-emitting dye as the guest tends to have a short lifetime in many cases, and is not for practical applications. Although the mechanism is not revealed sufficiently, the cause of shortening the lifetime is thought to be, for example, that the guest molecules diffuse in the host and aggregate together.

Furthermore, when dissolved in a solvent, these conjugated polymeric materials tend to have a high intrinsic viscosity. For this reason, there is a disadvantage that an increase in the concentration of ink increases the viscosity of the ink. This results in adverse influences such as a lowered landing precision of ink in printing with an inkjet or the like. Alternatively, if the concentration of ink is decreased to reduce the viscosity, ink application is needed multiple times to apply ink to a given thickness, accordingly deteriorating the throughput.

An object of the present invention is to provide green and red conversion films capable of keeping a sufficient intensity of converted light over a long period without increase in thickness. Another object of the present invention is to provide such a color conversion film formable by a wet process carried out at low cost. Moreover, still another object of the present invention is to provide a multicolor emission organic EL device using the color conversion film, and to provide a multicolor emission organic EL device which is excellent in viewing angle dependency, which does not cause a change in hue as the driving time elapses or the flowing current changes, and which exhibits light emitting properties stably over a long period.

Solution to Problem

As a result of earnest studies, it have been found out that a green-color conversion material having a sufficient color-conversion efficiency and capable of thin film formation by a coating process is obtained from a pendant-type polymeric compound in which an arylaminoanthracene derivative having a low tendency to cause concentration quenching is introduced to a polymer chain of a polystyrene derivative. Further, it has been found out that use of such pendant-type polymeric compounds as a host material of a red conversion film enables formation of a long-lifetime red conversion film having a low tendency to deteriorate a low-molecular-weight guest. Moreover, it has been found out that use of a polystyrene derivative having a low intrinsic viscosity as a main chain polymer allows the concentration of ink to increase without significantly increasing the viscosity. Thereby, effects of improving the printing precision in panel printing and shortening the throughput are produced.

The present inventors have completed the present invention based on such research results. Specifically, a first aspect of a pendant-type polymeric compound of the present invention is characterized in that the pendant-type polymeric compound comprises: at least one repeating unit represented by the following general formula (1) and at least one repeating unit represented by the following general formula (2), wherein n/(m+n)=1/100 to 100/100 provided that the molar ratio of (1):(2) is m:n.

[Chemical formula 1]

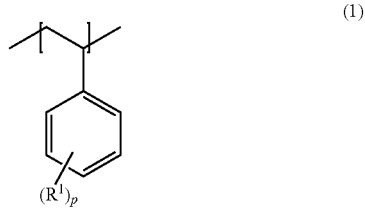

[Chemical formula 2]

(2)

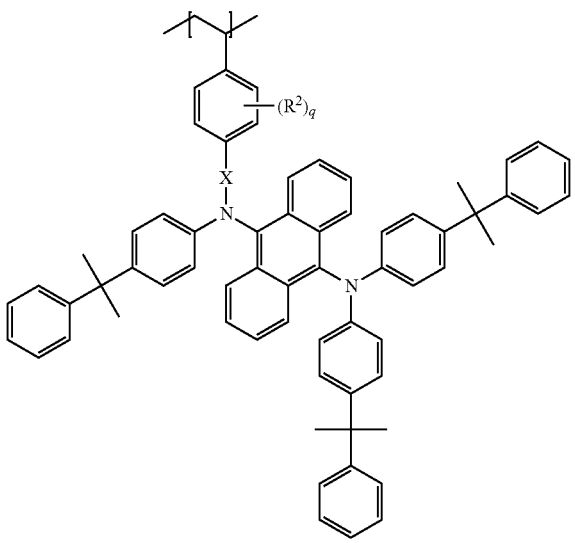

wherein $R^1$ and $R^2$ each independently represent a hydrogen atom, a hydroxyl group, an alkyl group having 1 to 10 carbon atoms which may have a substituent, an aryl group having 6 to 20 carbon atoms which may have a substituent, an arylalkyl group having 7 to 20 carbon atoms which may have a substituent, a heterocyclic group having 2 to 20 carbon atoms which may have a substituent, a (substituted) amino group, a halogen atom, a nitro group or a cyano group; X represents a direct bond or a linking group represented by any one of the following general formulas (3) to (5); p is a number of 1 to 5; q is a number of 1 to 4; a methylene group in the alkyl group having 1 to 10 carbon atoms or the arylalkyl group having 7 to 20 carbon atoms which may have a substituent represented by $R^1$ and $R^2$ may be interrupted by —O—, —S—, —CO—, —COO—, —OCO—, —SO$_2$—, —NH—, —NR'—CONH—, —NHCO—, —CONR'—, —NR'CO—, —N=CH— or —CH=CH—; and R' represents an alkyl group having 1 to 10 carbon atoms which may have a substituent, or an aryl group having 6 to 20 carbon atoms which may have a substituent.

[Chemical formula 3]

(3)

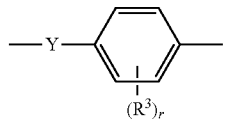

(4)

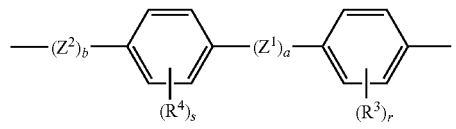

(5)

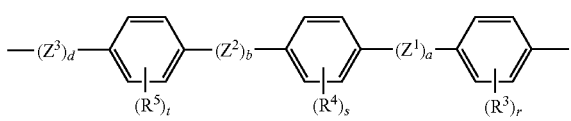

wherein $R^3$, $R^4$ and $R^5$ each independently represent a hydrogen atom, a hydroxyl group, an alkyl group having 1 to 10 carbon atoms which may have a substituent, an aryl group having 6 to 20 carbon atoms which may have a substituent, an arylalkyl group having 7 to 20 carbon atoms which may have a substituent, a heterocyclic group having 2 to 20 carbon atoms which may have a substituent, a (substituted) amino group, a halogen atom, a nitro group or a cyano group; Y represents a direct bond, —O—, —S—, —CO—, —COO—, —OCO—, —SO$_2$—, —NH—, —NR'—, —CONH—, —NHCO—, —CONR'—, —NR'CO—, —N=CH—, —CH=CH—, an alkylene group having 1 to 20 carbon atoms which may have a substituent, a cycloalkylene group having 6 to 20 carbon atoms which may have a substituent, a cycloalkenylene group having 6 to 20 carbon atoms which may have a substituent, or an arylene group having 6 to 20 carbon atoms which may have a substituent; $Z^1$, $Z^2$ and $Z^3$ each independently represent a direct bond, —O—, —S—, —CO—, —COO—, —OCO—, —SO$_2$—, —NH—, —NR'—, —CONH—, —NHCO—, —N=CH—, —CH=CH—, an alkylene group having 1 to 20 carbon atoms which may have a substituent, a cycloalkylene group having 6 to 20 carbon atoms which may have a substituent, a cycloalkenylene group having 6 to 20 carbon atoms which may have a substituent, or an arylene group having 6 to 20 carbon atoms which may have a substituent; r, s and t are each independently a number of 1 to 4; a, b and d are each independently a number of 0 or 1; a methylene group in the alkyl group having 1 to 10 carbon atoms and the arylalkyl group having 7 to 20 carbon atoms which may have a substituent represented by $R^3$, $R^4$ and $R^5$, and in the alkylene group having 1 to 20 carbon atoms represented by $Z^1$, $Z^2$ and $Z^3$ may be interrupted by —O—, —S—, —CO—, —COO—, —OCO—, —SO$_2$—, —NH—, —NR'—, —CONH—, —NHCO—, —CONR'—, —NR'CO—, —N=CH— or —CH=CH—; and R' is as defined in the general formulas (1) and (2).

A second aspect of the pendant-type polymeric compound of the present invention is characterized in that the pendant-type polymeric compound comprises at least one repeating unit represented by the general formula (1) and at least one repeating unit represented by the following general formula (6), and n/(m+n)=1/100 to 100/100 provided that the molar ratio of (1):(6) is m:n.

[Chemical formula 4]

(6)

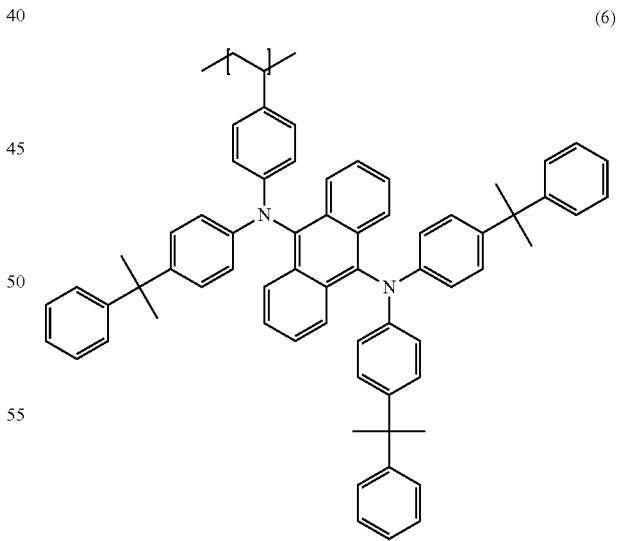

Moreover, a third aspect of the pendant-type polymeric compound of the present invention is characterized in that the pendant-type polymeric compound comprises at least one repeating unit represented by the general formula (1) and at least one repeating unit represented by the following general formula (7), and n/(m+n)=1/100 to 100/100 provided that the molar ratio of (1):(7) is m:n.

[Chemical formula 5]

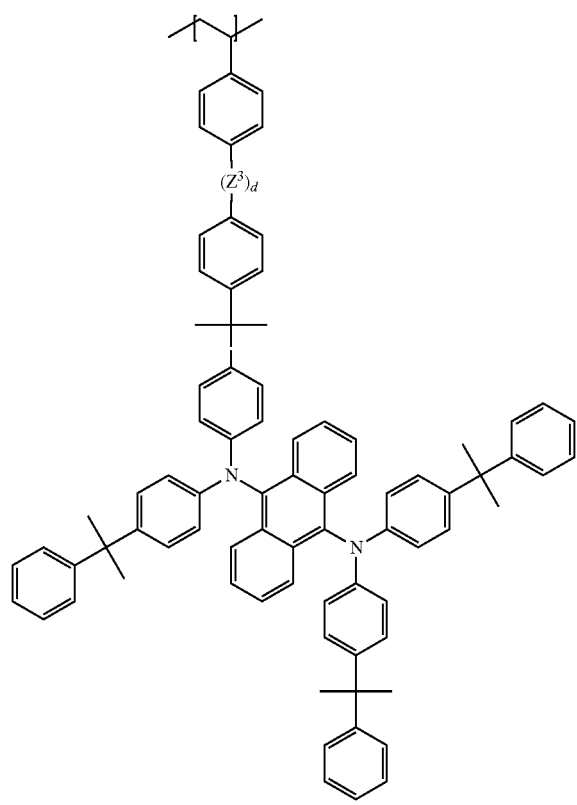

(7)

wherein $Z^3$ and d are as defined in the general formula (5).

A film of the present invention comprises any one of the first to the third aspects of the pendant-type polymeric compound.

A first aspect of a color conversion film of the present invention comprises any one of the first to third aspects of the pendant-type polymeric compound.

Moreover, a second aspect of the color conversion film of the present invention is characterized by comprising the pendant-type polymeric compound of the any one of the first to the third aspects, and a low-molecular-weight dye compound.

A color-converting light-emitting device of the present invention is characterized by comprising an organic EL element, and the color conversion film of anyone of the above two aspects.

Advantageous Effects of Invention

The present invention makes it possible to improve a fluorescence quantum yield in the form of a thin film and to obtain a sufficient color-conversion efficiency for use as a color conversion film by using a pendant-type polymeric compound in which an arylaminoanthracene derivative having a low tendency to cause concentration quenching is introduced to a polymer chain of a polystyrene derivative. Further, use of such pendant-type polymeric compounds as a host material of a advanced CCM red conversion film enables formation of a long-lifetime red conversion film having a low tendency to deteriorate a low-molecular-weight guest. Moreover, use of a polystyrene derivative having a low intrinsic viscosity as a main chain polymer allows the concentration of ink to increase without significantly increasing the viscosity, producing effects of improving printing precision and throughput in printing.

Therefore, a green-color conversion material in a case of using the pendant-type polymeric compound alone and a host material of a red conversion film in a case of combination with an appropriate red emitting dye are capable of keeping a high color-conversion efficiency. Moreover, by selecting an appropriate solvent, it is possible to provide a color conversion film formable by a coating process carried out at low cost. Further, a multicolor emission organic EL device formed by using such a color conversion film is less dependent on viewing angle, does not cause a change in hue as the driving time elapses or the flowing current changes, and is capable of exhibiting light emitting properties stably over a long period.

DESCRIPTION OF EMBODIMENTS

Figure 1A:
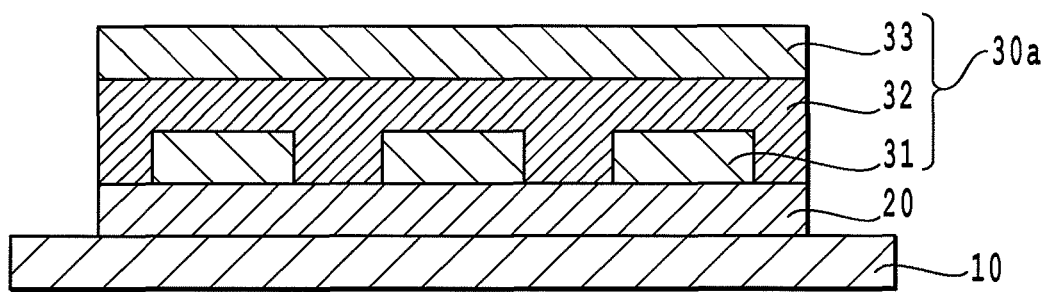
FIG. 1A is a view showing a configuration example of a multicolor emission organic EL device of the present invention, the view showing a configuration example of a bottom emission-type device.

Generally, many organic fluorescent materials, even if having a high fluorescence quantum yield in the form of a dilute solution, have a fluorescence quantum yield greatly decreased when formed into a solid thin film due to a concentration quenching effect of a strong intermolecular interaction. Nonetheless, as a result of detailed examinations, it has been found out that certain arylaminoanthracene derivatives have a high fluorescence quantum yield of 60% or more even in the form of a solid thin film.

These compounds include a relatively bulky substituent which suppresses the intermolecular interaction and presumably cause concentration quenching to occur in difficulty. Further, the arylaminoanthracene derivatives thus found include ones having a maximum emission wavelength located from 500 to 530 nm, which would be a promising candidate of a green-color conversion material. In other words, we have found out promising arylaminoanthracene derivatives as a candidate of a green-color conversion material.

Meanwhile, from the viewpoint of lowering the production cost, a color conversion film is preferably formed by a coating process (inkjet printing, dispenser coating, screen printing, spray deposition, or the like). Nevertheless, the above-described materials have a problem that the solubility to various solvents is low. This makes the formation by a coating process difficult. In addition, all of these arylaminoanthracene derivatives are so-called low-molecular-weight compounds having a molecular weight of 1000 or less. Such a low-molecular-weight compound has the following problem. Specifically, even if the low-molecular-weight compound is dissolved in a certain solvent, when a substrate is coated therewith, molecules of the low-molecular-weight compound gather and aggregate together before the solvent evaporates, thereby forming a powdery solid. This makes it difficult to form an amorphous continuous thin film.

As mean for solving these problems and for obtaining a color conversion film which is formable by a coating process carried out at low cost while having a high color-conversion efficiency, it is conceivable to polymerize these low-molecular-weight arylaminoanthracene derivatives.

To polymerize such a low-molecular-weight compound, a polymerization method is conceivable in which an appropriate polymerizable substituent is introduced to the low-molecular-weight compound, and the resultant is used as a monomer and polymerized. However, in such a method of polymerizing the low-molecular-weight compound as a monomer, the electronic state is often greatly changed from that of the initial low-molecular-weight compound by the introduction of the polymerizable substituent and the polymerization. As a result, the absorption and emission spectra favorable for a color conversion film, which the low-molecular-weight compound originally has, may not be retained after the polymerization.

As means for solving this, the low-molecular-weight compound is formed into a so-called pendant-type polymer in which the low-molecular-weight compound is linked to another polymer through an appropriate linking group. In the pendant-type polymer, what mainly contributes to light absorption and light emission is the low-molecular-weight compound moiety thus linked. Thus, it is expected that the absorption and emission spectra favorable for a color conversion film is retained even after the polymerization.

As the pendant-type polymer, it may use a polymeric compound comprising at least one repeating unit represented by the general formula (1) and at least one repeating unit represented by the general formula (2) with n/(m+n)=1/100 to 100/100 provided that the molar ratio of (1):(2) is m:n. The polymeric compound has a structure in which an arylaminoanthracene derivative having a low tendency to cause concentration quenching is introduced to a polymer chain of a polystyrene derivative.

Examples of the alkyl group having 1 to 10 carbon atoms which may have a substituent (i.e., either substituted or unsubstituted) at $R^1$ and $R^2$ in the general formulas (1) and (2) and $R^3$, $R^4$ and $R^5$ in the general formulas (3) to (5) include methyl, ethyl, propyl, isopropyl, butyl, secondary butyl, tertiary butyl, isobutyl, amyl, isoamyl, tertiary amyl, hexyl, cyclohexyl, cyclohexylmethyl, cyclohexylethyl, heptyl, isoheptyl, tertiary heptyl, n-octyl, isooctyl, tertiary octyl, 2-ethylhexyl, nonyl, isononyl, decyl, and the like. Examples of the aryl group having 6 to 20 carbon atoms which may have a substituent at $R^1$ and $R^2$ in the general formulas (1) and (2) and $R^3$, $R^4$ and $R^5$ in the general formulas (3) to (5) include phenyl, naphthyl, anthracen-1-yl, phenanthren-1-yl, and the like.

Examples of the arylalkyl group having 7 to 20 carbon atoms which may have a substituent at $R^1$ and $R^2$ in the general formulas (1) and (2) and $R^3$, $R^4$ and $R^5$ in the general formulas (3) to (5) include benzyl, phenethyl, 2-phenylpropyl, diphenylmethyl, triphenylmethyl, styryl, cinnamyl, and the like.

Examples of the heterocyclic group having 2 to 20 carbon atoms which may have a substituent at $R^1$ and $R^2$ in the general formulas (1) and (2) and $R^3$, $R^4$ and $R^5$ in the general formulas (3) to (5) include pyridyl, pyrimidyl, pyridazyl, piperazyl, piperidyl, pyranyl, pyrazolyl, triazyl, pyrrolidyl, quinolyl, isoquinolyl, imidazolyl, benzoimidazolyl, triazolyl, furyl, furanyl, benzofuranyl, thienyl, thiophenyl, benzothiophenyl, thiadiazolyl, thiazolyl, benzothiazolyl, oxazolyl, benzoxazolyl, isothiazolyl, isoxazolyl, indolyl, julolidyl, morpholinyl, thiomorpholinyl, 2-pyrrolidinon-1-yl, 2-piperidon-1-yl, 2,4-dioxyimidazolidin-3-yl, 2,4-dioxyoxazolidin-3-yl, carbazoyl, and the like.

Examples of the amino group at $R^1$ and $R^2$ in the general formulas (1) and (2) and $R^3$, $R^4$ and $R^5$ in the general formulas (3) to (5) include amino, ethylamino, dimethylamino, diethylamino, butylamino, cyclopentylamino, 2-ethylhexylamino, dodecylamino, anilino, chlorophenylamino, toluidino, anisidino, N-methyl-anilino, diphenylamino, naphthylamino, 2-pyridylamino, methoxycarbonylamino, phenoxycarbonylamino, acetylamino, benzoylamino, formylamino, pivaloylamino, lauroylamino, carbamoylamino, N,N-dimethylaminocarbonylamino, N,N-diethylaminocarbonylamino, morpholinocarbonylamino, methoxycarbonylamino, ethoxycarbonylamino, t-butoxycarbonylamino, n-octadecyloxycarbonylamino, N-methyl-methoxycarbonylamino, phenoxycarbonylamino, sulfamoylamino, N,N-dimethylaminosulfonylamino, methylsulfonylamino, butylsulfonylamino, phenylsulfonylamino, trimethylammonio, triethylammonio, and the like. The ammonio group having quaternary nitrogen may form a salt together with an anion.

Examples of the halogen atom at $R^1$ and $R^2$ in the general formulas (1) and (2) and $R^3$, $R^4$ and $R^5$ in the general formulas (3) to (5) include fluorine, chlorine, bromine, iodine, and the like.

Examples of the alkylene group having 1 to 20 carbon atoms which may have a substituent at Y in the general formula (3) and $Z^1$, $Z^2$ and $Z^3$ in the general formulas (4) and (5) include methylene, ethylene, trimethylene, isopropylene, tetramethylene, hexamethylene, 3-oxapentylene, 2-hydroxytrimethylene, and the like.

Examples of the cycloalkylene group having 6 to 20 carbon atoms which may have a substituent at Y in the general formula (3) and $Z^1$, $Z^2$ and $Z^3$ in the general formulas (4) and (5) include 1,2-cyclopropylene, 1,2-cyclopentylene, 1,2-cyclohexylene, 1,3-cyclohexylene, 1,4-cyclohexylene, 2-methyl 1,4-cyclohexylene, 3-methyl 1,4-cyclohexylene, 1,4-cycloheptylene, 1,5-cyclooctylene, 1,5-cyclononylene, 1,6-cyclodecanylene, and the like.

Examples of the cycloalkenylene group having 6 to 20 carbon atoms which may have a substituent at Y in the general formula (3) and $Z^1$, $Z^2$ and $Z^3$ in the general formulas (4) and (5) include 1,2-cyclohexenylene, 1,3-cyclohexenylene, 1,4-cyclohexenylene, 2-methyl-1,4-cyclohexenylene, 1,4-cycloheptenylene, 1,5-cyclooctenylene, 1,5-cyclononenylene, 1,6-cyclodecanylene, and the like.

Examples of the arylene group having 6 to 20 carbon atoms which may have a substituent at Y in the general formula (3) and $Z^1$, $Z^2$ and $Z^3$ in the general formulas (4) and (5) include 1,2-phenylene, 2-methyl-1,3-phenylene, 4,5-dimethyl-1,2-phenylene, 2,5-naphthylene, and the like.

Among the polymeric compounds containing at least one repeating unit represented by the general formula (1) and at least one repeating unit represented by the general formula (2) with n/(m+n)=1/100 to 100/100 provided that the molar ratio of (1):(2) is m:n, a polymeric compound containing at least one repeating unit represented by the general formula (1) and at least one repeating unit represented by the general formula (6) with n/(m+n)=1/100 to 100/100 provided that the molar ratio of (1):(6) is m:n, or a pendant-type polymeric compound containing at least one repeating unit represented by the general formula (1) and at least one repeating unit represented by the general formula (7) with n/(m+n)=1/100 to 100/100 provided that the molar ratio of (1):(7) is m:n is preferable because the solubility and film-forming properties are favorable.

Accordingly, specific examples of the pendant-type polymeric compound of the present invention include the following compounds (C-1) to (C-12).

[Chemical formula 6]
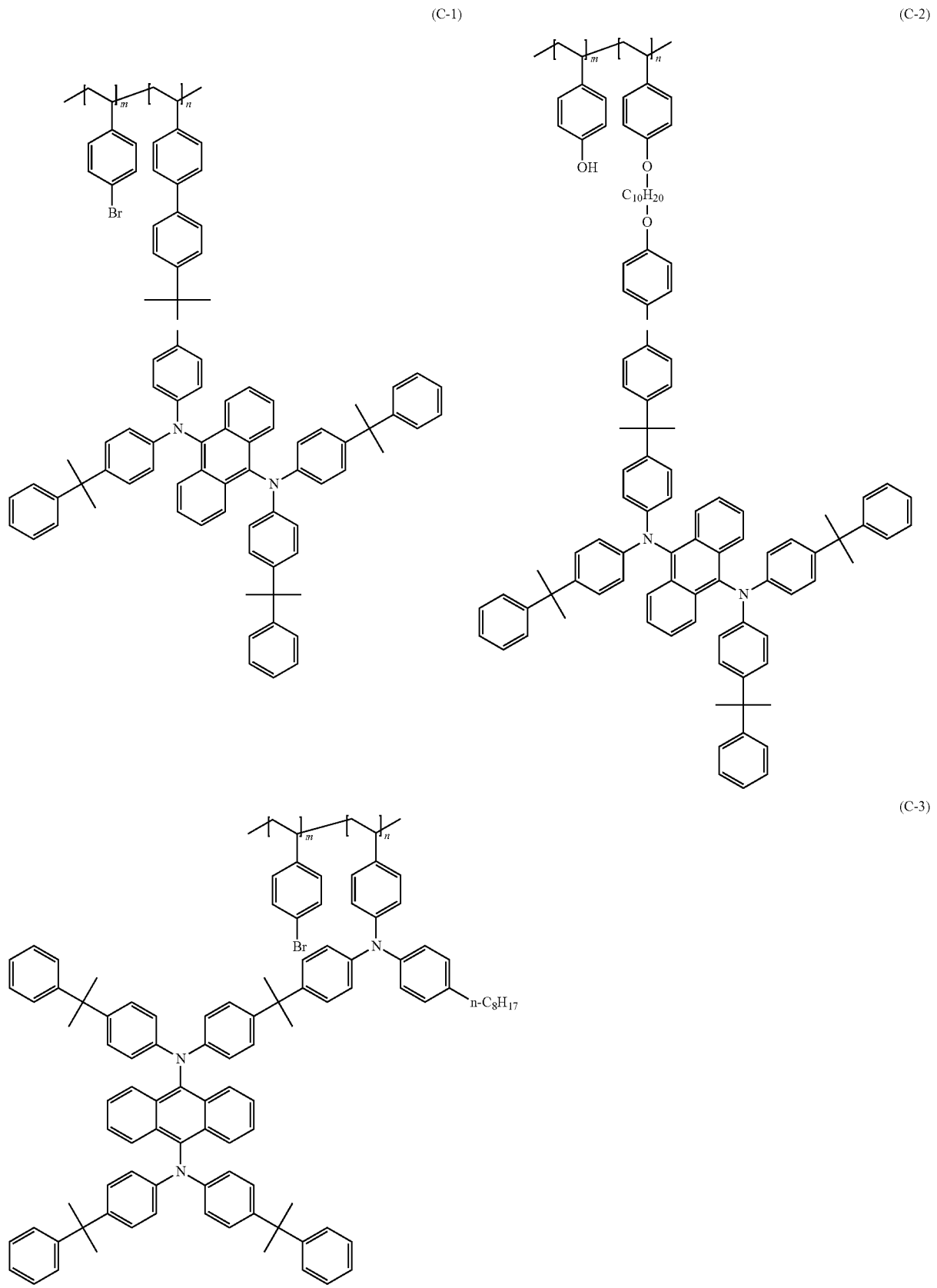

(C-4)
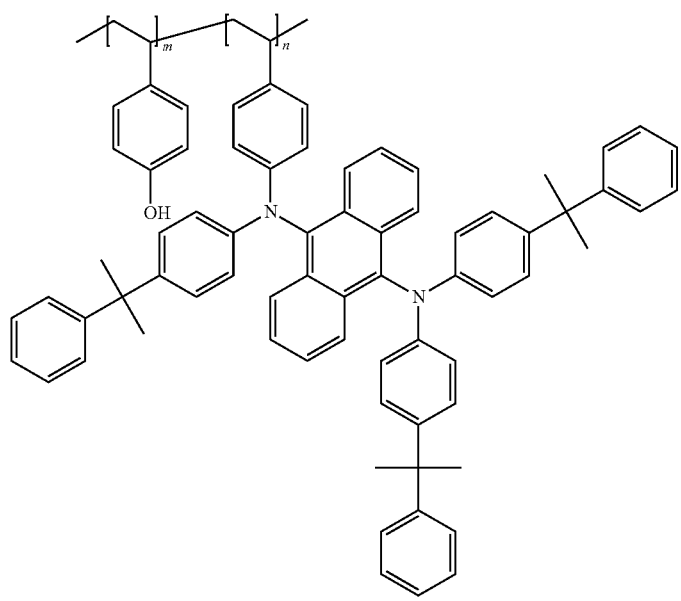
[Chemical formula 7]
(C-5)
(C-6)
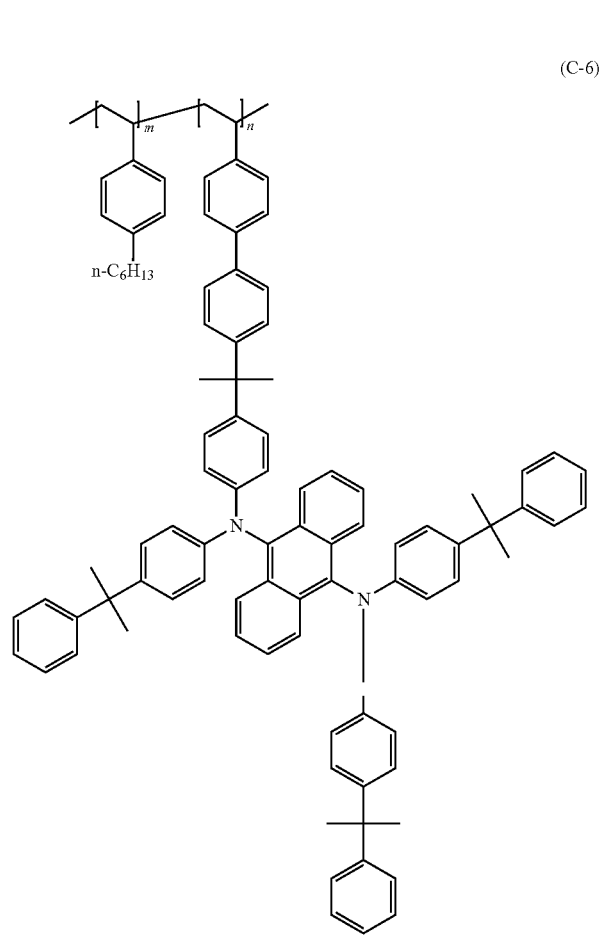

(C-7)
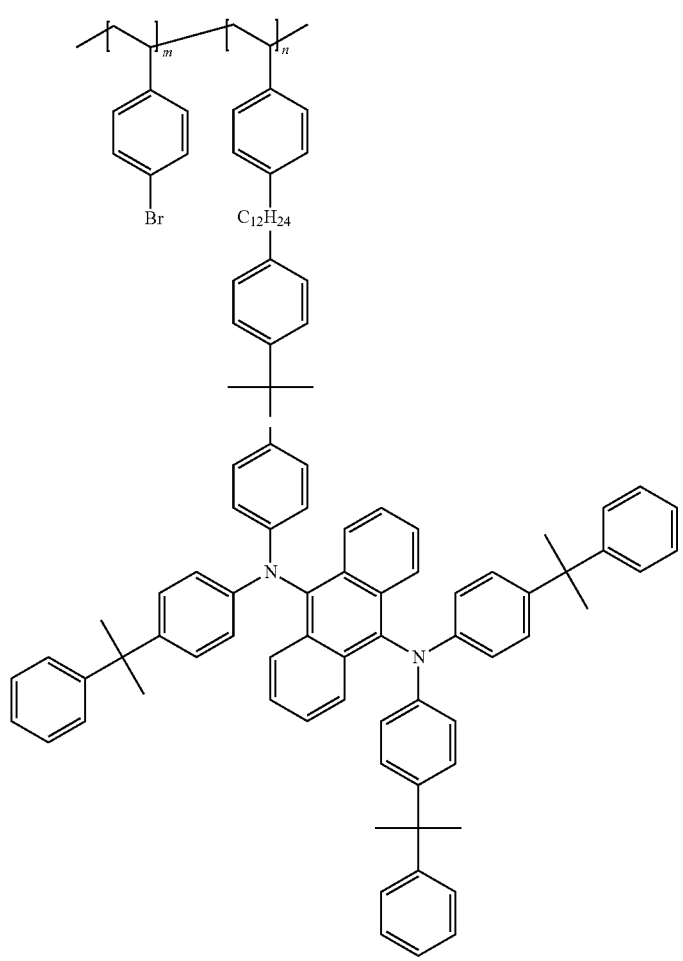
(C-8)
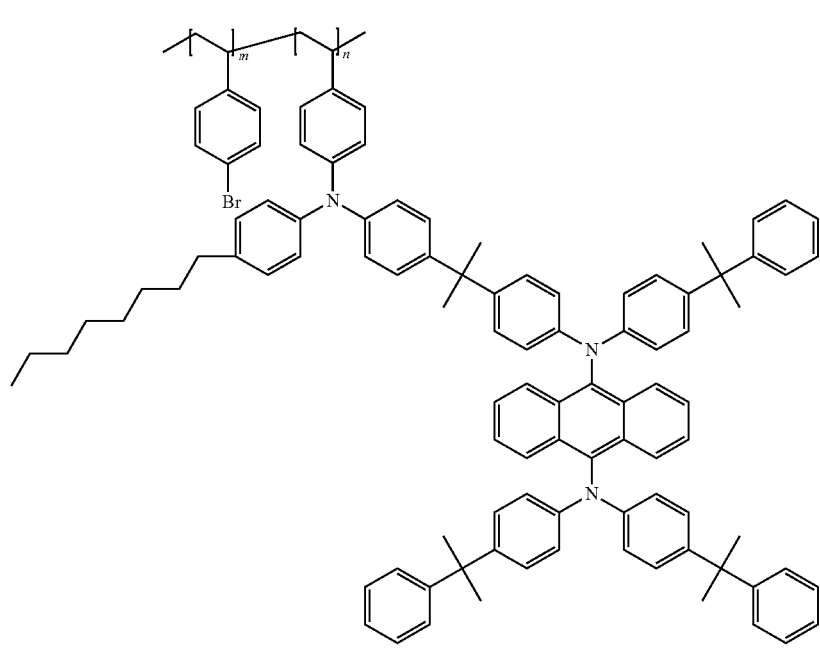

[Chemical formula 8]

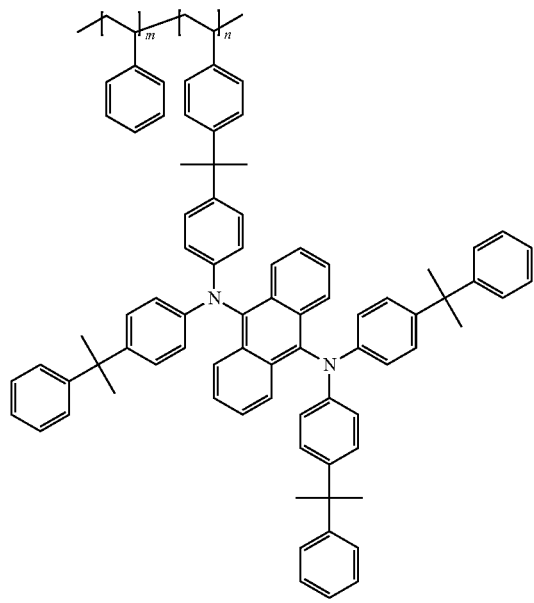
(C-9)

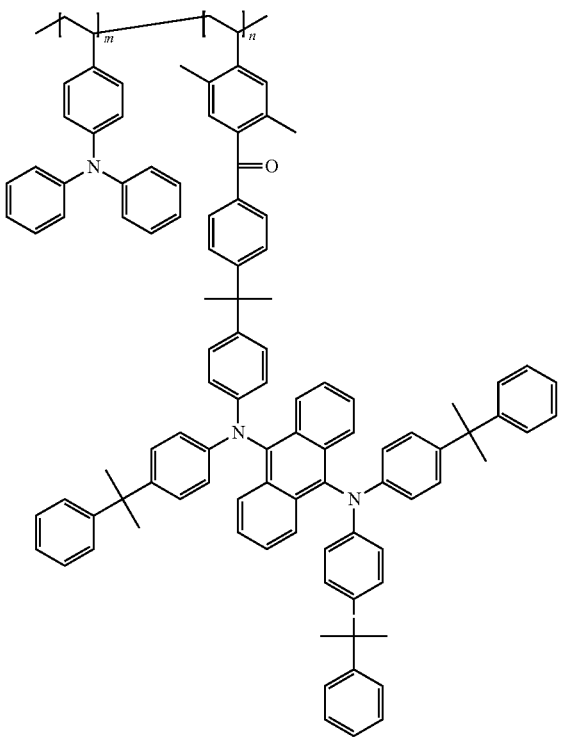
(C-10)

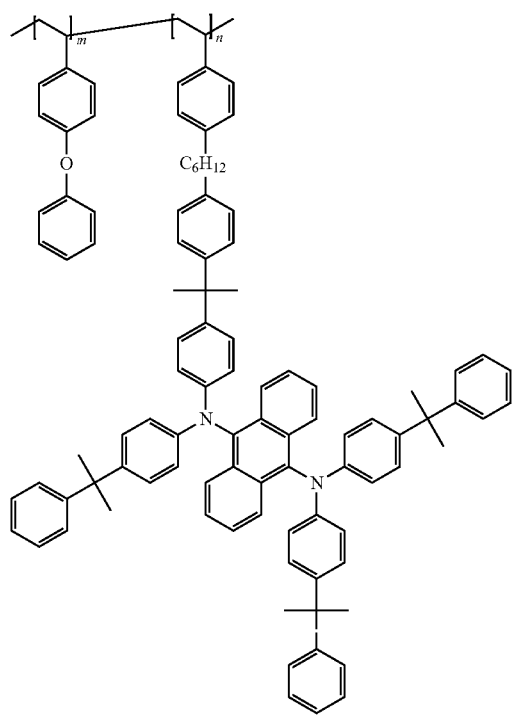
(C-11)

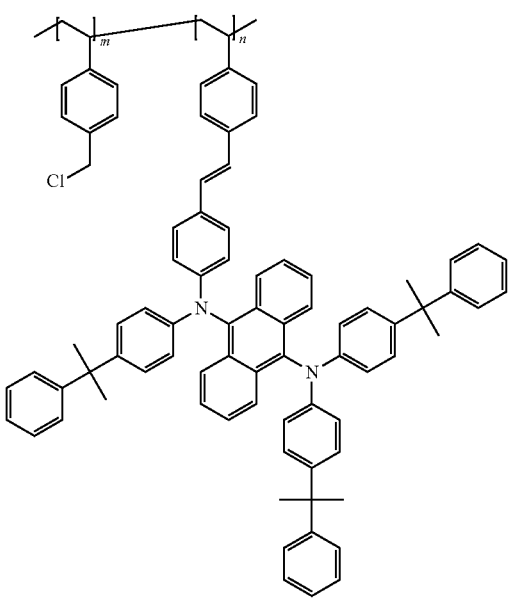
(C-12)

A method for producing the pendant-type polymeric compound of the present invention is not particularly limited. For example, in the case of the polymeric compound containing at least one repeating unit represented by the general formula (1) and at least one repeating unit represented by the following general formula (6) with n/(m+n)=1/100 to 100/100 provided that the molar ratio of (1):(6) is m:n, a target pendant-type polymeric compound can be obtained, for example, as illustrated in the following scheme 1, by reacting a compound (8) with a polystyrene polymer (C-13).

scheme 1

[Chemical formula 9]

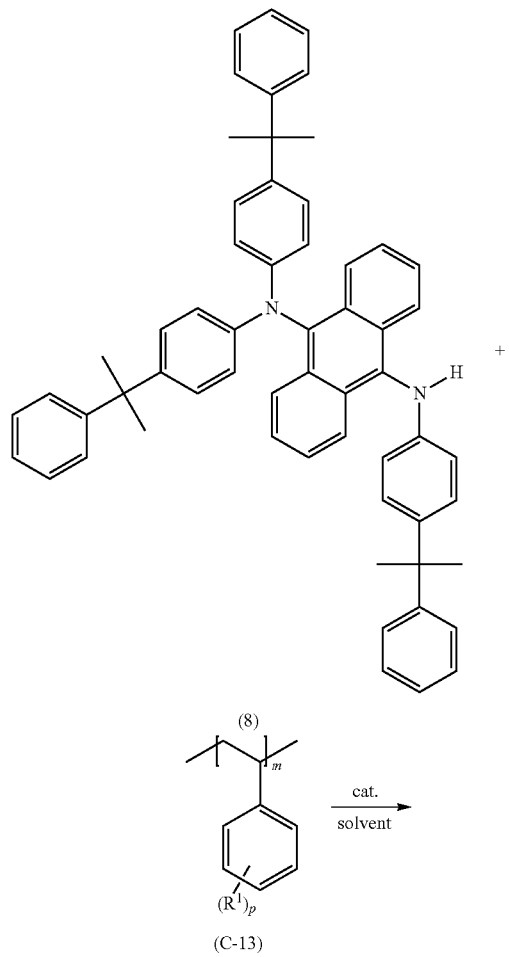

In addition, in the case of the pendant-type polymeric compound containing at least one repeating unit represented by the general formula (1) and at least one repeating unit represented by the following general formula (7) with $n/(m+n)=1/100$ to $100/100$ provided that the molar ratio of (1):(7) is m:n and d is 0, a target pendant-type polymeric compound (C-15) can be obtained, for example, as illustrated in the following scheme 2, by reacting a compound (8) with a compound (10) to obtain a compound (11), and then reacting the obtained compound (11) with polystyrene polymer (C-13).

scheme 2

[Chemical formula 10]

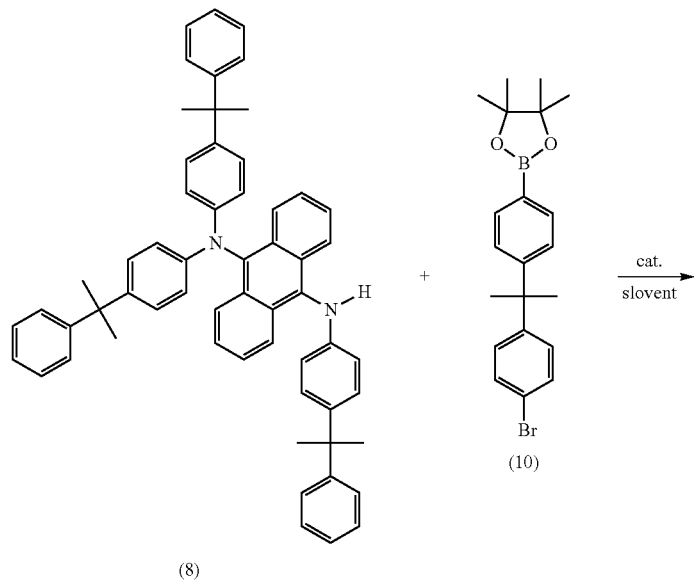

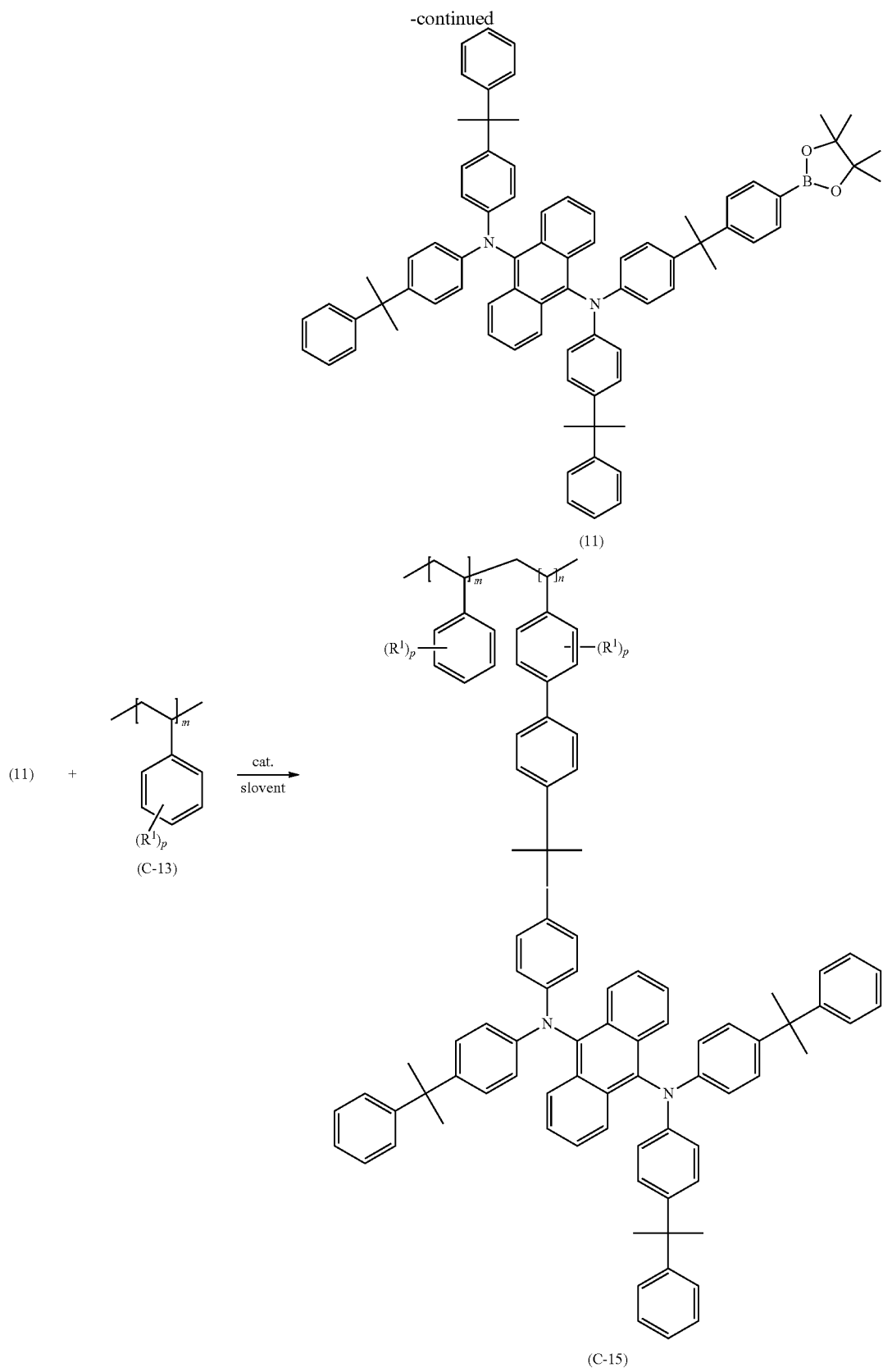
Moreover, in the case of the pendant-type polymeric compound containing at least one repeating unit represented by the general formula (1) and at least one repeating unit represented by the following general formula (7) with n/(m+n)=1/100 to 100/100 provided that the molar ratio of (1):(7) is m: n, $Z^3$ is —O—R"—O— (R" is an alkylene group having 1 to 20 carbon atoms which may have a substituent), and d is 1, a target pendant-type polymeric compound (C-16) can be obtained, for example, as illustrated in the following scheme 3, by reacting 4-iodophenol (compound (13)) with diiodoalkyl (compound (14)) to obtain a compound (15), reacting the compound (15) with a compound (11) obtained in the scheme 2 to obtain a compound (16), and then reacting the obtained compound (16) with a polystyrene polymer (C-13).

scheme 3

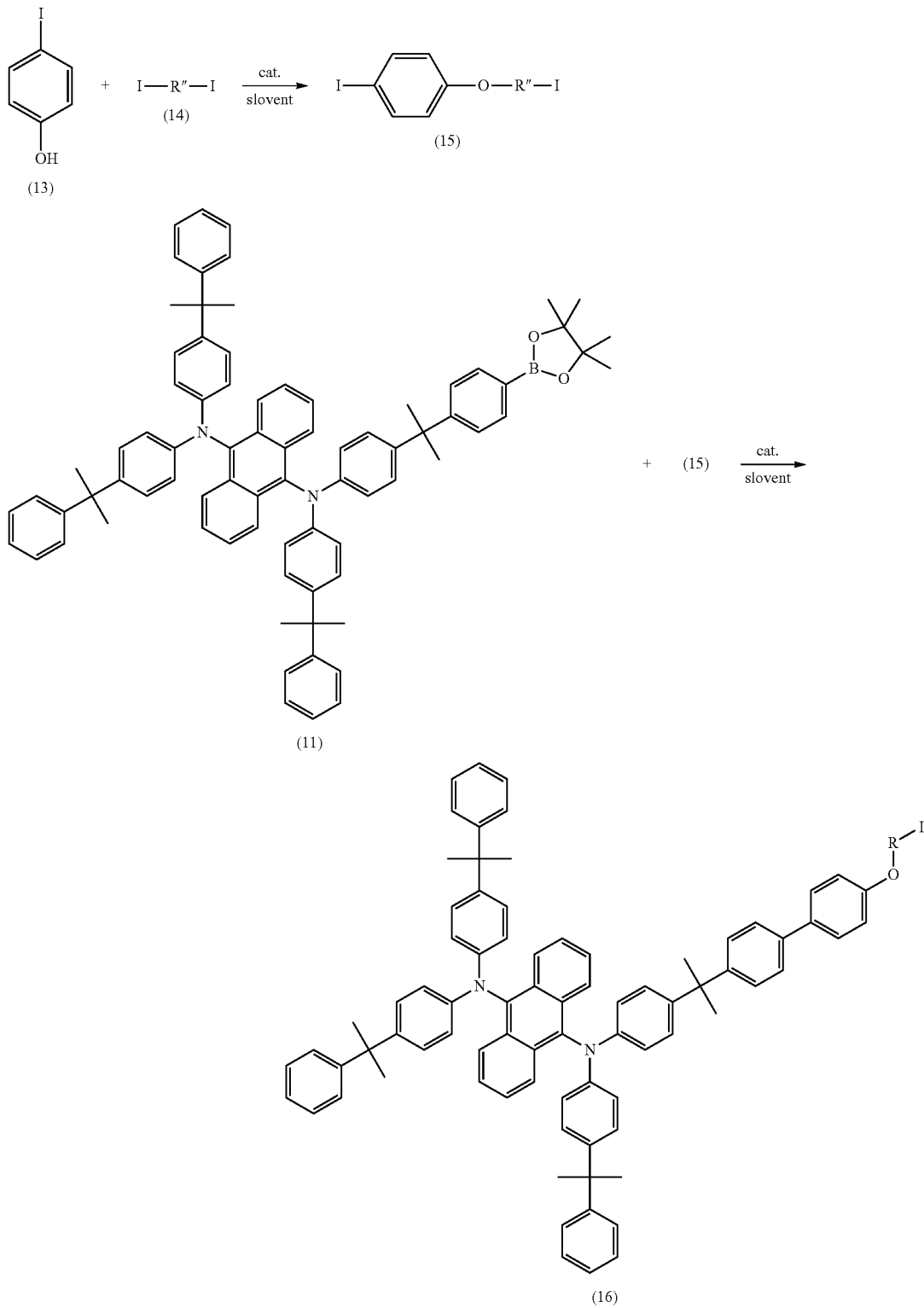

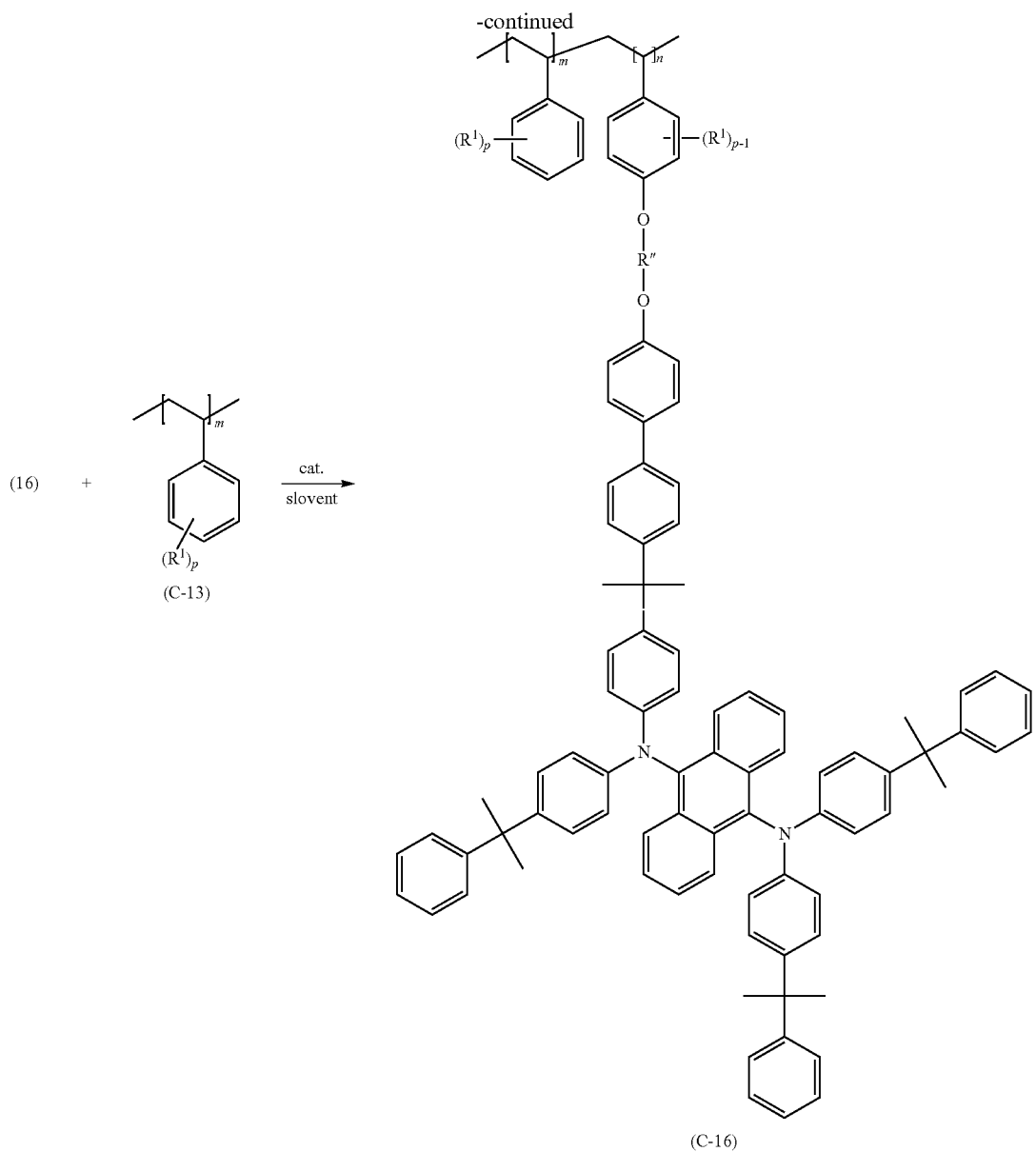

The production methods illustrated in the schemes 1 to 3 are preferable because it is easy to control the molecular weight of a pendant-type polymeric compound to be obtained.

In the production methods illustrated in the schemes 1 to 3, for example, the following reactions can be employed: 1) a cross-coupling reaction between an arylamine and an aryl halide; 2) the Suzuki coupling reaction; and 3) etherification from an alcohol (phenol) and an alkyl halide (Williamson synthesis). However, the reaction is not particularly limited, and various reactions can be employed. Hereinafter, the reactions 1) to 3) will be described in detail.

The reaction 1) is a method of obtaining an aromatic amino derivative by a cross-coupling reaction between an organic amino compound and an aryl halide in an appropriate solvent in the presence of a catalyst and a base. The reaction can be carried out under conditions: a reaction temperature of 20° C. to 300° C., more preferably 50° C. to 150° C., and a reaction period of several minutes to 72 hours, more preferably 1 to 10 hours. As the catalyst, an organic palladium compound, copper powder, or the like can be used.

The palladium compound is not particularly limited. For example, one obtained by reacting a palladium precursor with at least one kind of an appropriate ligand can be used.

Examples of the palladium precursor include tetravalent palladium compounds such as sodium hexachloropalladate (IV) tetrahydrate and potassium hexachloropalladate(IV); divalent palladium compounds such as palladium(II) chloride, palladium(II) bromide, palladium(II) acetate, palladium(II) acetylacetonate, dichlorobis(benzonitrile)palladium(II), dichlorobis(acetonitrile)palladium(II), dichlorobis(triphenylphosphine)palladium(II), dichlorotetraamminepalladium(II), dichloro(cycloocta-1,5-diene)palladium(II), and palladium(II) trifluoroacetate; zerovalent palladium compounds such as tris(dibenzylideneacetone)dipalladium(0), tris(dibenzylideneacetone)dipalladium(0) chloroform complex, tetrakis(tributylphosphine)palladium(0), and tetrakis(triphenylphosphine)palladium(0); and the like.

Examples of the ligand include organic phosphorus compounds such as triethylphosphine, tri-t-butyl-phosphine, tri-t-butyl-phosphonium tetrafluoroborate, tris-ortho-tolyl-phosphine, tris-cyclohexyl-phosphine, 2-di-t-butylphosphino-1,1'-bisphenyl, 2-dicyclohexylphosphino-2',4',6'-triisopropyl-1,1'-bisphenyl, (2-biphenyl)di-t-butylphosphine, R(−)-di-t-butyl-[1-[(S)-2-(dicyclohexylphosphinyl)ferrocenyl]ethyl]phosphine, racemic di-t-butyl-[1-[2-(dicyclohexylphosphinyl)ferrocenyl]ethyl]phosphine, (R)-1-((S)-2-(di-t-butylphosphino)ferrocenyl)ethyl-di-ortho-tolylphosphine, racemic 1-(2-(di-t-butylphosphino)ferrocenyl)ethyl-di-ortho-tolylphosphine, 1,1'-bis(diphenylphosphino)ferrocene, 1,1'-bis(di-t-butylphosphino)ferrocene, R-1-[(S)-2-(diphenylphosphino)ferrocenyl]ethyl-dicyclohexyl phosphine, racemic 1-[2-(diphenylphosphino)ferrocenyl]ethyl-dicyclohexylphosphine, 2,2'-bis(diphenylphosphino)-1,1'-binaphthyl, R(+)-2,2'-bis(di-p-tolylphosphino)-1,1'-binaphthyl, racemic 2,2'-bis(di-p-tolylphosphino)-1,1'-binaphthyl, 9,9-dimethyl-4,5-bis(diphenylphosphino)xanthene, 2-dicyclohexylphosphino-(N,N-dimethylamino)-1,1'-biphenyl, 1,3-bis(2,6-diisopropylphenyl)imidazolium chloride, 1,2-bis(1-adamantyl)imidazolium chloride, t-butyl-di-1-adamantylphosphine, R-1-[(S)-2-(2'-diphenylphosphinophenyl)ferrocenyl]ethyl-di-t-butylphosphine, 2-di-t-butylphosphino-(N,N-dimethylamino)-1,1'-biphenyl, and triphenylphosphine.

The amount of the catalyst is preferably 0.001 to 0.5 mol per 1 mol of the organic amino compound.

The base may be selected from inorganic bases such as sodium or potassium carbonate and alkali metal alkoxides, and organic bases such as a tertiary amine, but is not particularly limited. More preferable examples of the base include alkali metal alkoxides such as sodium methoxide, sodium ethoxide, potassium methoxide, potassium ethoxide, lithium-t-butoxide, sodium-t-butoxide, and potassium t-butoxide. The amount of the base used may be any amount, but is generally preferably 0.5 to 20 mol, more preferably 1 to 10 mol, per 1 mol of the organic amino compound.

As the solvent, an inert solvent is preferably used. The inert solvent should be a solvent which does not significantly inhibits the reaction. Examples thereof include aromatic hydrocarbon solvents such as benzene, toluene, and xylene; ether solvents such as diethyl ether, tetrahydrofuran, and dioxane; acetonitrile, dimethylformamide, dimethyl sulfoxide, hexamethylphosphotriamide, and the like. More preferable examples are aromatic hydrocarbon solvents such as benzene, toluene, and xylene. As to the amount used, the solvent is normally used in a ratio of 0.1 to 90 parts by mass, preferably 2 to 30 parts by mass, of the raw materials to be used.

The reaction is preferably carried out at normal pressure in an inert gas such as nitrogen or argon. Nevertheless, the reaction can be carried out even under a pressurized condition.

The reaction 2) is a method of obtaining an asymmetrical biphenyl derivative by a cross-coupling reaction between an aromatic boron compound and an aryl halide in the presence of a catalyst and a base. The conditions are preferably: a reaction temperature of 0° C. to 150° C., and a reaction period of normally 1 to 500 hours, although the reaction period varies depending on conditions such as the reaction temperature.

Examples of the catalyst include catalysts made of: transition metal complexes including palladium complexes such as [tetrakis(triphenylphosphine)]palladium, [tris(dibenzylideneacetone)]palladium, and palladium acetate, and nickel complexes such as [tetrakis(triphenylphosphine)]nickel, [1,3-bis(diphenylphosphino)propane]dichloronickel, and [bis(1,4-cyclooctadiene)]nickel; and, as necessary, further ligands such as triphenylphosphine, tri(t-butylphosphine), tricyclohexylphosphine, diphenylphosphirinopropane, and dipyridyl.

As the catalyst, one previously synthesized may be used, or one prepared in the reaction system may be used.

The catalyst may be used in any amount. However, generally, the amount of the catalyst is preferably 0.01 to 300 mol, further preferably 0.1 to 20 mol, per 1 mol of the organic amino compound.

Examples of the base include inorganic bases such as sodium carbonate, potassium carbonate, cesium carbonate, potassium fluoride, cesium fluoride, and tripotassium phosphate; and organic bases such as tetrabutylammonium fluoride, tetrabutylammonium chloride, tetrabutylammonium bromide, and tetrabutylammonium hydroxide.

The base may be used in any amount. However, generally, the amount of the base is preferably 0.5 to 20 mol, more preferably 1 to 10 mol, per 1 mol of the organic amino compound.

The reaction 2) may be carried out under a condition using a solvent as necessary. Examples of the solvent used include water, toluene, xylene, mesitylene, tetrahydrofuran, 1,4-dioxane, dimethoxyethane, N,N-dimethylacetamide, N,N-dimethylformamide, and the like. These may be used alone or may be used in mixture of two or more thereof.

As to the amount used, the solvent is normally used in a ratio of 0.1 to 90 parts by mass per 1 part by mass of the raw materials to be used. Preferably, the solvent is used in a ratio of 2 to 30 parts by mass per 1 part by mass of the raw materials.

Although differing depending on the compounds or reaction to be used, it is generally desirable that oxygen contained in the solvent be removed from the solvent in order to suppress a side reaction.

The reaction 3) is a method of obtaining a symmetrical or an asymmetrical ether by reacting an alcohol (phenol) with an alkyl halide in the presence of an alkali. In the reaction 3), the conditions are preferably: a reaction temperature of 50 to 150° C., and a reaction period of 1 to 20 hours.

Examples of the alkali include particulate sodium hydroxide, particulate potassium hydroxide, an aqueous solution containing 20 to 50% by mass of sodium hydroxide, and the like. To the alkali, a phase transfer catalyst such as a tetrabutylammonium salt may be added.

As the solvent, an inert solvent is preferably used. The inert solvent should be a solvent which does not significantly inhibits the reaction. Examples thereof include aromatic hydrocarbon solvents such as benzene, toluene, and xylene; ether solvents such as diethyl ether, tetrahydrofuran, and dioxane; acetonitrile, dimethylformamide, dimethyl sulfoxide, hexamethylphosphotriamide, water, and the like. As to the amount used, the solvent is normally used in a ratio of 0.1 to 90 parts by mass, preferably 2 to 30 parts by mass, of the raw materials to be used.

As the structure of the pendant-type polymeric compound of the present invention, the polymeric compound exclusive of the pendant moiety may be either a random copolymer, an alternating copolymer, a block copolymer, or a graft copolymer, and can be produced by copolymerization such as solution polymerization, mass polymerization, suspension polymerization, or emulsion polymerization. The weight-average molecular weight of the pendant-type polymeric compound of the present invention is preferably 3,000 to 3,000,000.

The pendant-type polymeric compound of the present invention is useful as an light conversion film for various uses in, beside an organic electroluminescent display described later, dye lasers, bioimaging, solar cells, liquid crystal displays, agricultural films, light-emitting diodes, and so forth.

A film of the present invention contains any one of the first to the third embodiments of the pendant-type polymeric compound. The film of the present invention can be formed by coating on a support the pendant-type polymeric compound of the present invention, or a mixture including the pendant-type polymeric compound of the present invention and a binder, by a dip coating method, an air-knife coating method, a curtain coating method, a roller coating method, a wire-bar coating method, a gravure coating method or an extrusion coating method. The film of the present invention may be used while being formed on a support. Meanwhile, the film of the present invention may have independency. In this case, an independent film can be obtained by peeling the film coated by the above-described method from the support.

Alternatively, an independent film may be directly formed from a mixture including the pendant-type polymeric compound of the present invention and a polymeric material listed below by extrusion molding, cast molding or roll molding. Examples of the polymeric material that can be used include cellulose esters such as diacetyl cellulose, triacetyl cellulose (TAC), propionyl cellulose, butyryl cellulose, acetyl propionyl cellulose, and nitrocellulose; polyamides; polycarbonates; polyesters such as polyethylene terephthalate, polyethylene naphthalate, polybutylene terephthalate, poly-1,4-cyclohexanedimethylene terephthalate, polyethylene-1,2-diphenoxyethane-4,4'-dicarboxylate, and polybutylene terephthalate; polystyrenes; polyolefins such as polyethylenes, polypropylenes, and polymethylpentenes; acrylic resins such as polymethyl methacrylate; polycarbonates; polysulfones; polyethersulfones; polyetherketones; polyetherimides; polyoxyethylenes; norbornene resins; and the like.

As a result of earnest studies, the present inventors have found out that use of a pendant-type polymeric compound in which an arylaminoanthracene derivative having a low tendency to cause concentration quenching is introduced to a polymer chain of a polystyrene derivative enables formation of a green conversion film formable by a coating process carried out at low cost while having a sufficient color-conversion efficiency in the form of a thin film. Specifically, a first embodiment of a color conversion film of the present invention contains any one of the first to the third embodiments of the pendant-type polymeric compound.

As a result of further examination, it has been revealed that the pendant-type polymeric compound has excellent performances as a host material of a red conversion film.

As described above, it is difficult to achieve red-color conversion using a color conversion film made of a single material. It is effective to use an advanced CCM color conversion film having a host/guest configuration. In such an advanced CCM color conversion film formable by a coating process, it is considered to use a polymeric compound as the host, and use a low-molecular-weight compound as the red-color guest. However, even if the advanced CCM color conversion film having such a configuration has a high color-conversion efficiency at an early stage of formation, as time elapses, the efficiency is rapidly lowered in many cases. Generally, a polymeric film has a large free volume, and a low-molecular-weight compound present therein easily diffuses and moves in the film. In the advanced CCM color conversion film having the above-described configuration, as time elapses, low-molecular-weight red-color guest molecules diffuse in the film and aggregate together, causing concentration quenching. This is assumed to be the cause of the lowered efficiency.

Nevertheless, it has been revealed that, when used as a host material of a red conversion film in combination with a low-molecular-weight guest material, the pendant-type polymeric compound continuously keeps its high conversion efficiency over a long period. The arylaminoanthracene derivative introduced to the pendant-type polymer has bulky substituents. These substituents hinder the diffusion of the low-molecular-weight guest, suppressing concentration quenching. As a result, it is assumed that the high conversion efficiency is kept.

The color conversion film of the present invention has a thickness of 3000 nm (3 µm) or less. In the color conversion film of the present invention, the fluorescence quantum yield of the pendant-type polymeric compound is kept at a high level even in the form of a thin film. Thus, the color conversion film of the present invention has a sufficient efficiency as a color conversion film even with such a thin thickness.

To form a color conversion film by a coating process, it is important that the concentration and viscosity of ink be controlled in addition that the color conversion material (the pendant-type polymeric compound of the present invention) have a favorable solubility. If the concentration of ink is low, a film formed by a single coating step is thin, and ink application is needed multiple times to achieve a desired film thickness. Hence, to form a thin film by a coating process, it is desirable to use ink of a high concentration corresponding to the desired thickness in a range not deteriorating the film properties. However, if the concentration of the solution is increased, normally this increases the solution viscosity. The increase in the solution viscosity often brings about problems such as increase in resistance and clogging in a pipe of a coater.

Another effect of using the pendant-type polymer as a color conversion material is to make it easy to control the solution viscosity. Such a viscosity of the pendant-type polymer is mainly determined by the viscosity of the main chain polymer. As the polymer main chain to which a low-molecular-weight compound is linked, any polymer may be used, as long as the properties of the low-molecular-weight compound are not deteriorated. Thus, by employing a material having a low intrinsic viscosity as the polymer chain, the intrinsic viscosity of the pendant-type polymer can be lowered. An example of such a polymer includes a polystyrene. If such a polymer having a low intrinsic viscosity is employed, this enables adjustment of ink having a reduced viscosity but having a high concentration favorable for coating processes while the color conversion film retains its high performances.

In a case where the color conversion film is formed solely of the color conversion material, the color conversion film of this embodiment can be formed by applying a solution of the pendant-type polymeric compound. Alternatively, as described later, a color conversion filter may be formed by coating on an appropriate transparent support the solution of the pendant-type polymeric compound together with another component.

The material that can be used as the transparent support may be glasses or polymeric materials including cellulose esters such as diacetyl cellulose, triacetyl cellulose (TAC), propionyl cellulose, butyryl cellulose, acetyl propionyl cellulose, and nitrocellulose; polyamides; polycarbonates; polyesters such as polyethylene terephthalate, polyethylene naphthalate, polybutylene terephthalate, poly-1,4-cyclohexanedimethylene terephthalate, polyethylene-1,2-diphenoxyethane-4,4'-dicarboxylate, and polybutylene terephthalate; polystyrenes; polyolefins such as polyethylenes, polypropylenes, and polymethylpentenes; acrylic resins such as polymethyl methacrylate; polycarbonates; polysulfones; polyethersulfones; polyetherketones; polyetherimides; polyoxyethylenes; and norbornene resins.

When the polymeric material is used, the transparent supporter may be rigid or may be flexible. The transparent supporter preferably has a transmittance of 80% or more for visible light, and further preferably has a transmittance of 86% or more.

The color conversion film of the present invention may contain an oxygen absorber in such an amount that the color conversion properties are not adversely influenced. The conjugated high-molecular-weight polymer is readily oxidized when irradiated with light in the presence of oxygen, and the fluorescence quantum yield may be decreased. Against this, the present invention contains an oxygen absorber, and thereby such oxidation can be prevented, and decrease in the fluorescence quantum yield can be prevented.

Examples of the oxygen absorber include metals such as iron, aluminium, lithium, sodium, zinc, and barium, inorganic compounds such as cuprous oxide and ferrous chloride, and organic compounds such as hydroquinone and aniline.

The color conversion film of the present invention may have a surface provided with an oxygen barrier film capable of sufficiently transmitting converted light. The oxygen barrier film can shield the color conversion film from oxygen in an atmosphere, and prevent oxidation of the color conversion film, and decrease in the fluorescence quantum yield can be prevented.

Examples of the oxygen barrier film include plastic films made of polycarbonates, polyethylene terephthalate, nylons, and the like; an aluminium foil, a silicon oxide film, a silicon nitride film; films having aluminium, a silicon oxide film, or a silicon nitride film formed on the aforementioned plastic films; and the like.

A color-converting light-emitting device of the present invention is characterized by including an organic EL element and the second embodiment of the color conversion film, the organic EL element including: a pair of electrodes, at least one of which is transparent; and an organic EL layer sandwiched between the pair of electrodes.

FIGS. 1A to 1D show examples of a structure of the color-converting light-emitting device of the present invention. The device of FIG. 1A has a configuration of a transparent substrate 10/a color conversion film 20/an organic EL element 30a. Here, the organic EL element 30a includes a transparent electrode 31, an organic EL layer 32 and reflective electrode 33. The device of FIG. 1A has a configuration in which the color conversion, film 20 is in contact with the transparent electrode 31, and is a so-called bottom emission-type device which emits light toward the transparent substrate 10.

Figure 1B:
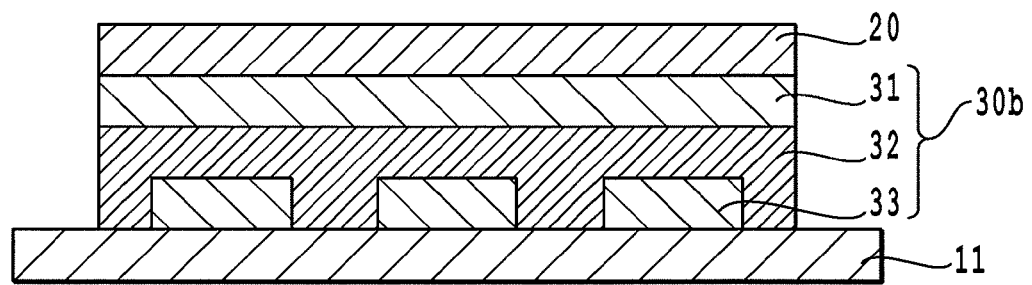
FIG. 1B is a view showing a configuration example of the multicolor emission organic EL device of the present invention, the view showing a configuration example of a top emission-type device.

The device of FIG. 1B has a configuration of a substrate 11/an organic EL element 30b/the color conversion film 20. Here, the organic EL element 30b includes the transparent electrode 31, the organic EL layer 32 and the reflective electrode 33 as in the case of the element 30a, but the order of stacking is opposite. The device of FIG. 1B has a configuration in which the color conversion film 20 is in contact with the transparent electrode 31, and is a so-called top emission-type device which emits light to a side opposite to the substrate 11.

In the devices of FIGS. 1A and 1B, one of the pair of electrodes is the transparent electrode 31. Light (EL light) emitted by the organic EL layer 32 is emitted directly, or reflected by the reflective electrode 33, in a direction to the transparent electrode 31, and enters the color conversion film 20. Part of the EL light is absorbed by a first dye and the energy is transferred to a second dye. Thereafter, light (photoluminescent light, PL light) having a different wavelength distribution is emitted. Accordingly, with the PL light and EL light not absorbed by the color conversion film 20, the devices function as a multicolor emission organic EL device.

Figure 1C:
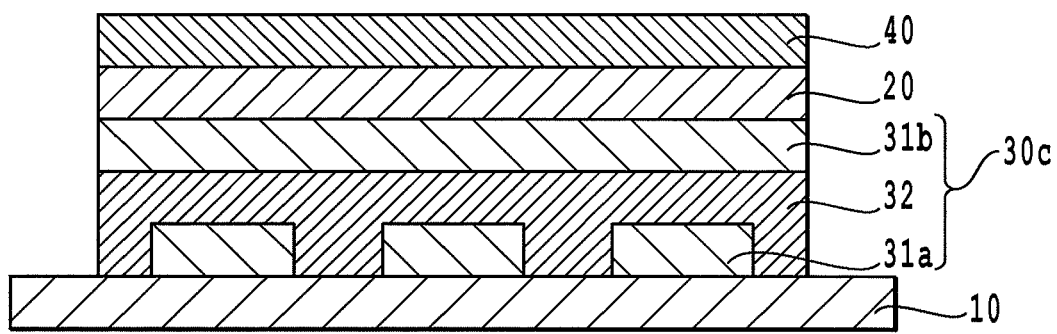
FIG. 1C is a view showing a configuration example of the multicolor emission organic EL device of the present invention, the view showing a configuration example of a bottom emission-type device.

Meanwhile, the device of FIG. 1C has a configuration of the transparent substrate 10/an organic EL element 30c/the color conversion film 20/a reflective layer 40. Here, the organic EL element 30c includes a first transparent electrode 31a, the organic EL layer 32 and a second transparent electrode 31b. The device of FIG. 1C is a bottom emission-type device. The device of FIG. 1D has a configuration of the substrate 11/the reflective layer 40/the color conversion film 20/the organic EL element 30c. The device of FIG. 1D is a top emission-type device.

Figure 1D:
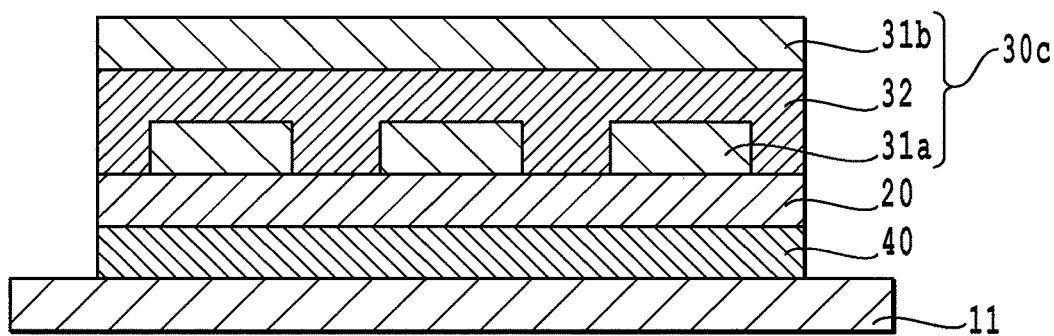
FIG. 1D is a view showing a configuration example of the multicolor emission organic EL device of the present invention, the view showing a configuration example of a top emission-type device.

In the devices of FIGS. 1C and 1D, both of the pair of electrodes are the transparent electrodes 31(a, b). Part of EL light emitted by the organic EL layer 32 is emitted to the outside (in FIG. 1C, in a direction to the transparent substrate 10; in FIG. 1D, in a direction to the second transparent electrode 31b) without bypassing the color conversion film 20. Of the EL light, light directed in a direction to the color conversion film 20 is partially absorbed by the color conversion film 20 and converted to PL light. Further, light passing through the color conversion film 20 is reflected by the reflective layer 40, and again enters the color conversion film 20. After undergoing wavelength-distribution conversion, the light further passes through the organic EL element 30c and emitted to the outside.

In any of the devices of FIGS. 1A to 1D, the color conversion film 20 is arranged in contact with the transparent electrode 31 (including the first and the second transparent electrodes 31a, 31b). This arrangement minimizes the distance between the organic EL layer 32 and the color conversion film 20, and is effective in improving the EL light-entering efficiency into the color conversion film 20 and simultaneously in reducing the viewing angle dependency.

Which configuration is to be employed is determined in accordance with a desired device use, a hue required for the device, and so forth. Hereinafter, each of the constituents of the color-converting light-emitting device of the present invention will be described.

The transparent substrate 10 and the substrate 11 should withstand the conditions (solvent, temperature, and so forth) employed for formation of layers to be stacked, and are preferably excellent in dimensional stability. The material of the transparent substrate 10 used in the bottom emission-type configuration of FIGS. 1A and 1C may be inorganic materials such as glasses, or may be polymeric materials including cellulose esters such as diacetyl cellulose, triacetyl cellulose (TAC), propionyl cellulose, butyryl cellulose, acetyl propionyl cellulose, and nitrocellulose; polyamides; polycarbonates; polyesters such as polyethylene terephthalate, polyethylene naphthalate, polybutylene terephthalate, and polybutylene terephthalate; polystyrenes; polyolefins such as polyethylenes, polypropylenes, and polymethylpentenes; acrylic resins such as polymethyl methacrylate; polycarbonates; polysulfones; polyethersulfones; polyetherketones; polyetherimides; polyoxyethylenes; and norbornene resins. When the polymeric material is used, the transparent substrate 10 may be rigid or may be flexible. The transparent substrate 10 preferably has a transmittance of 80% or more for visible light, and further preferably has a transmittance of 86% or more.

Meanwhile, the substrate 11 used in the top emission-type configuration of FIGS. 1B and 1D is not required to be transparent. Accordingly, in addition to the above-described materials usable for the transparent substrate 10, metals, ceramics, or the like can be used.

The transparent electrode 31 (including the first and the second transparent electrodes 31a, 31b) preferably has a transmittance of 50% or more, more preferably 85% or more, for light at a wavelength of 400 to 800 nm. The transparent electrode 31 can be formed using ITO (In—Sn oxide), Sn oxide, In oxide, IZO (In—Zn oxide), Zn oxide, Zn—Al oxide, Zn—Ga oxide, or transparent conductive metal oxides obtained by adding a dopant such as F or Sb to these oxides. The transparent electrode 31 is formed adopting a vapor deposition method, a sputtering method or a chemical vapor deposition (CVD) method, preferably formed using a sputtering method. Moreover, in a case where a transparent electrode 31 made of multiple partial electrodes is needed as described below, the transparent electrode 31 made of multiple partial electrodes may be formed by forming a transparent conductive metal oxide uniformly over the entire surface, followed by etching to define a desired pattern. Alternatively, the transparent electrode 31 made of multiple partial electrodes may be formed using a mask to define a desired shape. Alternatively, the patterning can be performed by employing a lift-off process.

The transparent electrode 31 formed from the above-described material is appropriate for use as an anode. Meanwhile, when the transparent electrode 31 is used as a cathode, a cathode buffer layer is desirably provided at an interface between the transparent electrode 31 and the organic EL layer 32 to improve the electron injection efficiency. As the material of the cathode buffer layer, an alkali metal such as Li, Na, K, or Cs, an alkaline earth metal such as Ba or Sr, alloys containing these metals, a rare earth metal, fluorides of these metals, or the like can be used, but without limitation thereto. The thickness of the cathode buffer layer can be selected as appropriate in consideration of the driving voltage, transparency, and so forth. In a normal case, 10 nm or less is preferable.

The organic EL layer 32 includes at least an organic light-emitting layer, and as necessary has a structure in which a hole injection layer, a hole transporting layer, an electron transporting layer and/or an electron injection layer are interposed. Alternatively, a hole injection-transporting layer having both functions of injecting and transporting holes and an electron injection-transporting layer having both functions of injecting and transporting electrons may be used. Specifically, the organic EL element to be employed has layer structures as follow. Note that, although the followings are shown to include an anode and a cathode, the organic EL layer is a layer present between the anode and the cathode.

(1) anode/organic light-emitting layer/cathode (2) anode/hole injection layer/organic light-emitting layer/cathode (3) anode/organic light-emitting layer/electron injection layer/cathode (4) anode/hole injection layer/organic light-emitting layer/electron injection layer/cathode (5) anode/hole transporting layer/organic light-emitting layer/electron injection layer/cathode (6) anode/hole injection layer/hole transporting layer/organic light-emitting layer/electron injection layer/cathode (7) anode/hole injection layer/hole transporting layer/organic light-emitting layer/electron transporting layer/electron injection layer/cathode In the above layer configurations, the anode and the cathode are each either the transparent electrode 31 (including the first and the second transparent electrodes 31a, 31b) or the reflective electrode 33.

Known materials are used as that of each layer constituting the organic EL layer 32. For example, as the material of the organic light-emitting layer to obtain blue to blue-green light emission, for example, benzothiazole-based, benzimidazole-based, benzoxazole-based and other fluorescent brightening agents, and materials such as metal-chelated oxonium compounds, styrylbenzene-based compounds, and aromatic dimethylidine-based compounds are preferably used.

As the material of the electron transporting layer, oxadiazole derivatives such as 2-(4-biphenyl)-5-(p-t-butylphenyl)-1,3,4-oxadiazole (PBD), triazole derivatives, triazine derivatives, phenylquinoxalines, aluminium-quinolinol complexes (for example, $Alq_3$), and the like can be used. As the material of the electron injection layer, in addition to the above-described materials of the electron transporting layer, aluminium-quinolinol complexes doped with alkali metals or alkaline earth metals can also be used.

As the material of the hole transporting layer, known materials including triarylamine-based materials such as TPD, N,N'-bis(1-naphthyl)-N,N'-diphenylbiphenylamine (α-NPD), and 4,4',4"-tris(N-3-tolyl-N-phenylamino)triphenylamine (m-MTDATA) can be used. As the material of the hole injection layer, phthalocyanines (copper phthalocyanine, and the like) indanthrene-based compounds, and the like can be used.

The reflective electrode 33 is preferably formed using a metal, an amorphous alloy, and a microcrystalline alloy, each of which has a high reflectance. Examples of the highly reflective metal include Al, Ag, Mo, W, Ni, Cr, and the like. Examples of the highly reflective amorphous alloy include NiP, NiB, CrP, CrB, and the like. Examples of the highly reflective microcrystalline alloy include NiAl and the like. The reflective electrode 33 may be used as a cathode or an anode. When the reflective electrode 33 is used as a cathode, the electron injection efficiency into the organic EL layer 32 may be improved by providing the above-described cathode buffer layer at an interface between the reflective electrode 33 and the organic EL layer 32. Alternatively, when the reflective electrode 33 is used as a cathode, the electron injection efficiency can be improved by alloying the above-described highly reflective metal, amorphous alloy or microcrystalline alloy through addition of a low-work-function material: alkali metals such as lithium, sodium, and potassium, or alkaline earth metals such as calcium, magnesium, and strontium. When the reflective electrode 33 is used as an anode, the hole injection efficiency into the organic EL layer 32 may be improved by providing a layer of the above-described transparent conductive metal oxides at an interface between the reflective electrode 33 and the organic EL layer 32.

Depending on the material used, the reflective electrode 33 can be formed by adopting any means known in the art such as vapor deposition (resistive heating or electron beam heating), sputtering, ion plating, or laser ablation. In a case where a reflective electrode 33 made of multiple partial electrodes is needed as described below, the reflective electrode 33 made of multiple partial electrodes may be formed using a mask to define a desired shape.

To form multiple independent light-emitting portions in the organic EL elements 30 (a to c) in FIGS. 1A to 1D, an example, can be illustrated in which the pair of electrodes are each formed from multiple parallel stripe-shaped portions in such a manner that stripes forming one of the electrodes and stripes forming the other electrode cross each other (preferably perpendicularly). Such an organic EL element is capable of matrix driving. Specifically, when a voltage is applied to a specific stripe of one electrode and a specific stripe of the other electrode, the organic EL layer 32 emits light at a portion where these stripes cross each other. Alternatively, patterning may be performed in such a manner that one electrode is formed as a uniform flat electrode having no stripe pattern and the other electrode is formed from multiple partial electrodes corresponding to each of light-emitting portions. In this case, multiple switching elements corresponding to each of the light-emitting portions are provided and connected to the partial electrodes corresponding to each of the light-emitting portions on a one-to-one basis, thereby enabling so-called active matrix driving. Alternatively, in a case where an organic EL device uniformly emitting light from the entire surface is desired, each of the pair of electrodes may be a uniform flat electrode.

The reflective layer 40 is preferably formed using the above-described highly reflective metal (Al, Ag, Mo, W, Ni, Cr, and the like), amorphous alloy (NiP, NiB, CrP, CrB, and the like), or microcrystalline alloy (NiAl and the like). Since the color conversion film 20 in the present invention is a thin film, a short circuit may possibly occur within the lower electrode (within 31*a*) or within the upper electrode (within 31*b*) via the reflective layer 40. To prevent this, an insulating layer may be provided between the reflective layer 40 and the color conversion film 20, or between the color conversion film 20 and the electrode (within the lower electrode 31*a* or within the upper electrode 31*b*). The insulating layer can be formed using a transparent insulating inorganic material such as $TiO_2$, $ZrO_2$, $AlO_x$, AlN, and $SiN_x$ having a refractive index (preferably approximately 1.5 to 2.0) close to that of the color conversion film 20.

In the color-converting light-emitting device of the present invention, by altering the kind of conjugated high-molecular-weight copolymer constituting the color conversion film 20, or by adjusting the thickness of the color conversion film 20, the amount of EL light absorbed in the color conversion film 20 can be adjusted. In addition to the adjustments on the amount of EL light absorbed and the amount of PL light emitted by these methods, by appropriately selecting the arrangement of the light conversion layer 20 as illustrated in FIGS. 1A to 1D, the multicolor emission organic EL device of the present invention can emit light of any hue including white light.

In the color-converting light-emitting device of the present invention, by altering the kind of conjugated high-molecular-weight copolymer constituting the color conversion layer 20, or by adjusting the thickness of the color conversion layer 20, the amount of EL light absorbed in the color conversion layer 20 can be adjusted. In addition to the adjustments on the amount of EL light absorbed and the amount of PL light emitted by these methods, by appropriately selecting the arrangement of the light conversion layer 20 as illustrated in FIGS. 1A to 1D, the multicolor emission organic EL device of the present invention can emit light of any hue including white light.

EXAMPLES

Hereinafter, the present invention will be described in more details by way of Examples, Evaluation Example and Comparative Examples. However, the present invention is not limited at all to Examples and the like below. Examples 1 to 8 below show synthesis examples of the polymeric compound of the present invention.

Example 1

Synthesis of Polymeric Compound (C-1)

A polymeric compound (C-1) was synthesized according to the following scheme.

[Chemical formula 12]

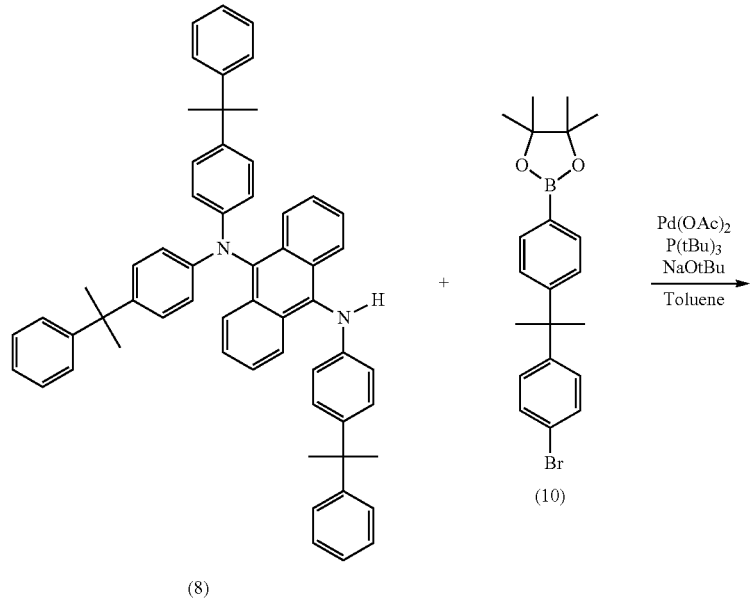

(8)

-continued
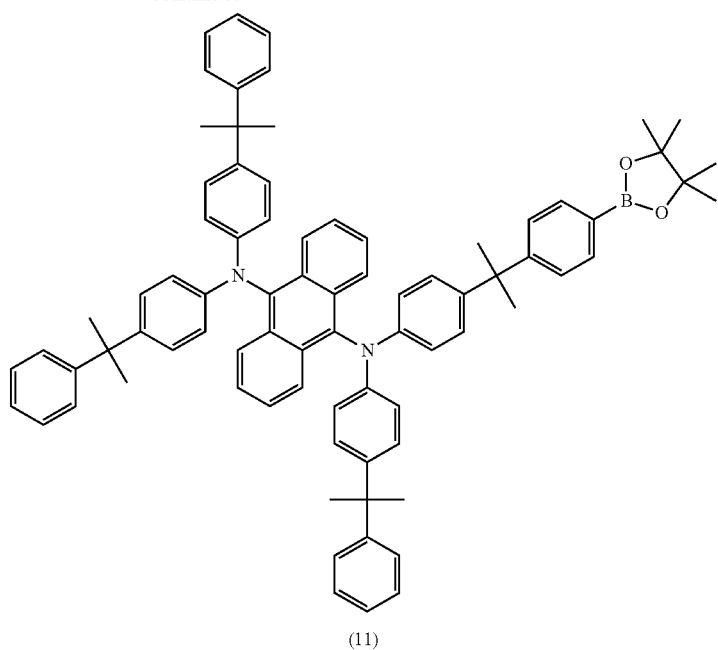
(11)
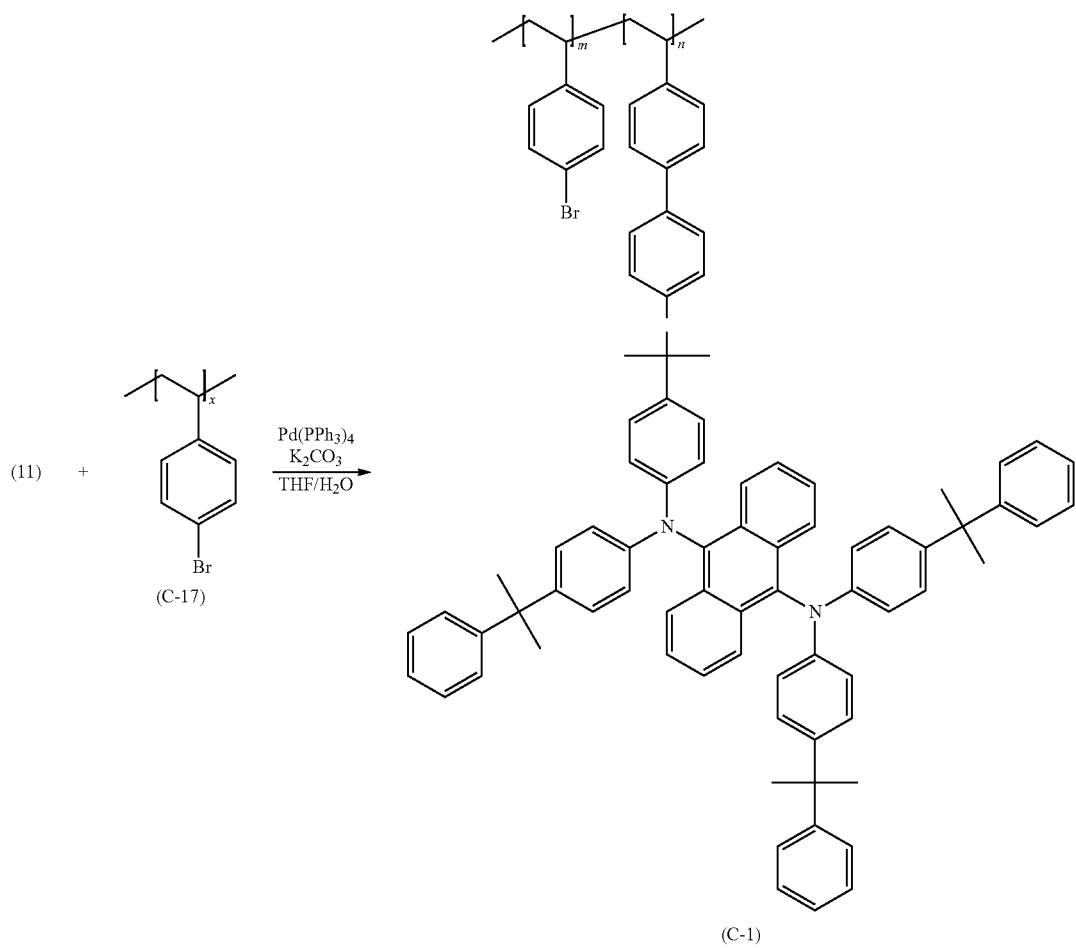

<Step 1> Synthesis of Compound (11)

In an argon atmosphere, 3.0 g (3.74 mmol) of a compound (8), 1.5 g (3.74 mmol) of a compound (10), 0.5 g (5.24 mmol) of sodium-t-butoxide and 30 ml of toluene were placed, to which a mixture of 8 mg (1 mol %) of palladium acetate and 20 mg of tri-t-butylphosphine dissolved in 0.5 ml of toluene was added, followed by stirring at 110° C. for 4 hours. After cooled to room temperature, the resultant was subjected to short column (toluene), dispersion washing with methanol, column chromatography (toluene:n-hexane=1:1→toluene), dispersion washing with methanol, and drying at 60° C. for 1 hour. Thus, 1.9 g of a yellow solid was obtained. This yellow solid was confirmed to be a compound (11) by NMR.

<Step 2> Synthesis of Polymeric Compound (C-1)

In an argon atmosphere, 0.2 g ($1.8 \times 10^{-4}$ mol) of the compound (II) obtained in Step 1, 0.13 g of a polymeric compound (C-17) (weight-average molecular weight: $7.18 \times 10^4$) and 14 ml of tetrahydrofuran (THF) were placed, to which 4.2 ml of a 2 M aqueous solution of potassium carbonate was added and then 20 mg (10 mol %) of tetrakis(triphenylphosphine)palladium was added, followed by stirring at 70° C. for 6 hours. After cooled to room temperature, the resultant was subjected to filtration with glass filter paper (GFP), oil water separation from toluene, drying with sodium sulfate, solvent removal, short column (toluene), reprecipitation (THF/n-hexane), dispersion washing with acetone, dispersion washing with ethanol, and drying at 60° C. for 2 hours. Thus, 0.18 g of a yellow solid was obtained.

The obtained yellow solid was confirmed to be a polymeric compound (C-1) by NMR. The weight-average molecular weight thereof was determined by a gel permeation chromatography (GPC) method. The values of m and n were obtained by comparing the numbers of protons of the respective side chains in the NMR measurement. Moreover, the fluorescent spectrum was measured using a film obtained by dissolving the polymeric compound (C-1), at a concentration of 20% by mass, in toluene or THF, coating a slide glass having a size of 2.5 cm×7.5 cm with this solution by a spin-coating process at 600 rpm for 30 second, followed by drying at 60° C. for 10 minutes to thus obtain the film. Table 1 shows the values of m and n as well as the evaluations of absorption and fluorescent properties of the film containing the polymeric compound.

Example 2

Synthesis of Polymeric Compound (C-2)

A polymeric compound (C-2) was synthesized according to the following scheme.

[Chemical formula 13]

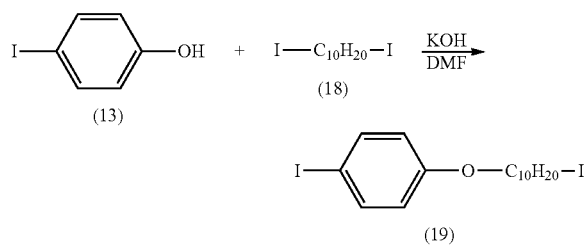

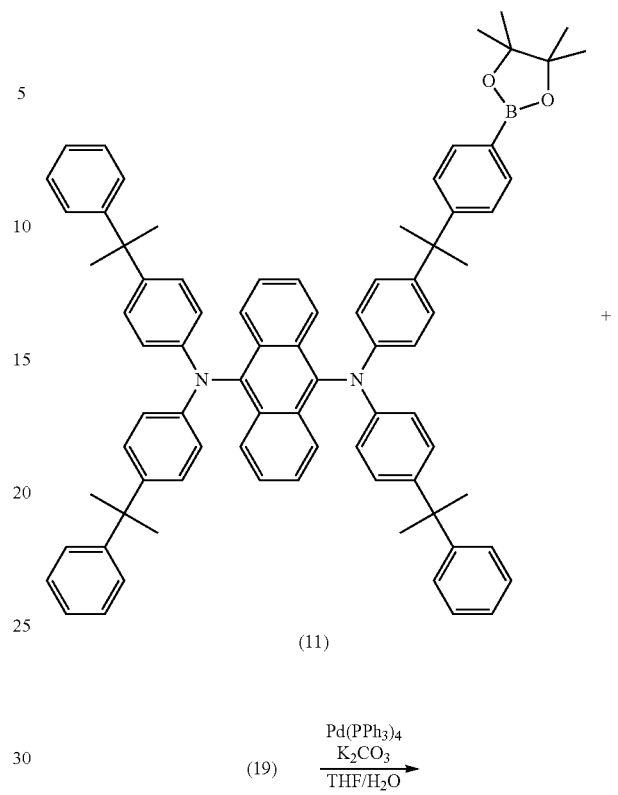

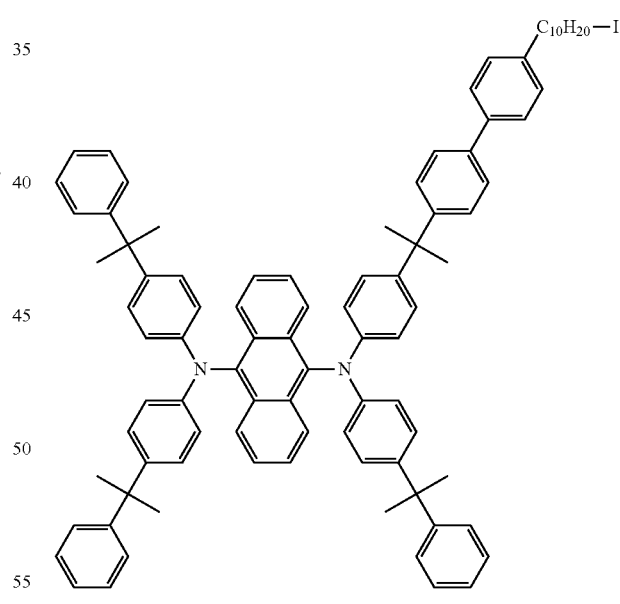

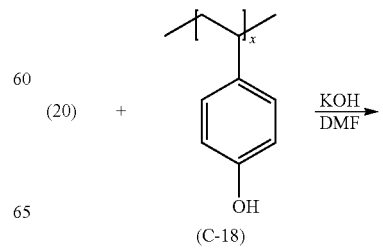

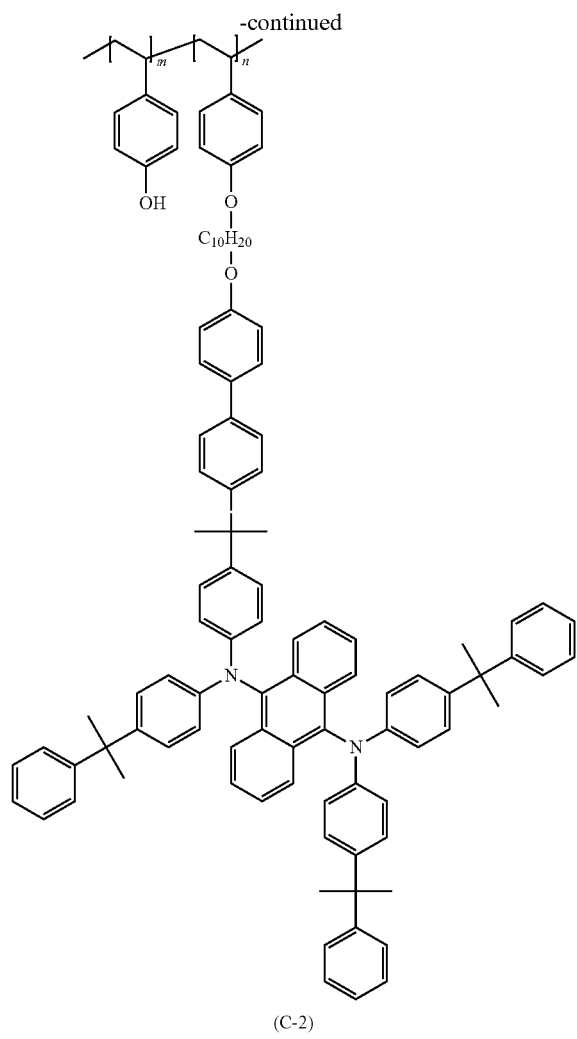

(C-2)

<Step 1> Synthesis of Compound (19)

In an argon atmosphere, 0.9 g ($2.54 \times 10^{-2}$ mol) of 1,10-diiododecane (compound (18)) and 30 g of dimethylformamide (DMF) were placed, followed by stirring at 70° C. Thereby, a DMF solution 1 was obtained. Separately, 2.8 g ($1.27 \times 10^{-2}$ mol) of 4-iodophenol (compound (13)) and 0.9 g ($1.33 \times 10^{-2}$ mol) of potassium hydroxide were dissolved in 30 g of DMF at 70° C. Thereby, a DMF solution 2 was obtained. The DMF solution 2 was added dropwise to the DMF solution 1, spending 30 minutes, followed by stirring for 2 hours. After cooled to room temperature, the reaction solution was poured into 500 ml of water and stirred for 1 hour. The resultant was subjected to oil water separation from 150 ml of chloroform, water washing, drying with sodium sulfate, solvent removal, crystallization from methanol, and drying at 30° C. for 1 hour. Thus, 3.1 g of a white solid was obtained. This white solid was confirmed to be a compound (19) by NMR.

<Step 2> Synthesis of Compound (20)

In an argon atmosphere, 0.7 g ($6.3 \times 10^{-4}$ mol) of a compound (II) obtained in Step 1 of Example 1 and 0.4 g ($6.9 \times 10^{-4}$ mol) of the compound (19) obtained in Step 1 were dissolved in 6 ml of THF, to which 2.6 ml of a 2 M aqueous solution of potassium carbonate was added. Then, 72 mg (10 mol %) of tetrakis(triphenylphosphine)palladium was added thereto, followed by stirring at 80° C. for 8 hours. After cooled to room temperature, the resultant was subjected to oil water separation from toluene, drying with sodium sulfate, solvent removal, column chromatography (toluene:n-hexane=1:2), and drying at 60° C. for 1 hour. Thus, 0.13 g of a yellow solid was obtained. The obtained yellow solid was confirmed to be a compound (20) by NMR.

<Step 3> Synthesis of Polymeric Compound (C-2)

A polymeric compound (C-18) (weight-average molecular weight: $2.14 \times 10^4$), 10 mg ($1.16 \times 10^{-4}$ mol) of potassium hydroxide and 1.9 g of DMF were placed and stirred at 70° C. To this solution, 0.13 g ($9.67 \times 10^{-5}$ mol) of the compound (20) obtained in Step 2 was added, followed by stirring for 7 hours. After cooled to room temperature, a dilute hydrochloric acid solution and THF were added thereto. The resultant was subjected to oil water separation. After water washing, drying with sodium sulfate, solvent removal, dispersion in methanol, reprecipitation (THF/n-hexane), methanol washing, and drying at 60° C. for 2 hours, 0.05 g of a yellow solid was obtained. The obtained yellow solid was confirmed to be a polymeric compound (C-2) by NMR. The values of m and n were obtained by comparing the numbers of protons of the respective side chains in the NMR measurement. Moreover, a film was formed as in Example 1, and the fluorescent spectrum was measured. Table 1 shows the values of m and n as well as the evaluations of absorption and fluorescent properties of the film containing the polymeric compound.

Example 3

Synthesis of Polymeric Compound (C-3) (m=73, n=27)

A polymeric compound (C-3) was synthesized according to the following scheme.

[Chemical formula 14]

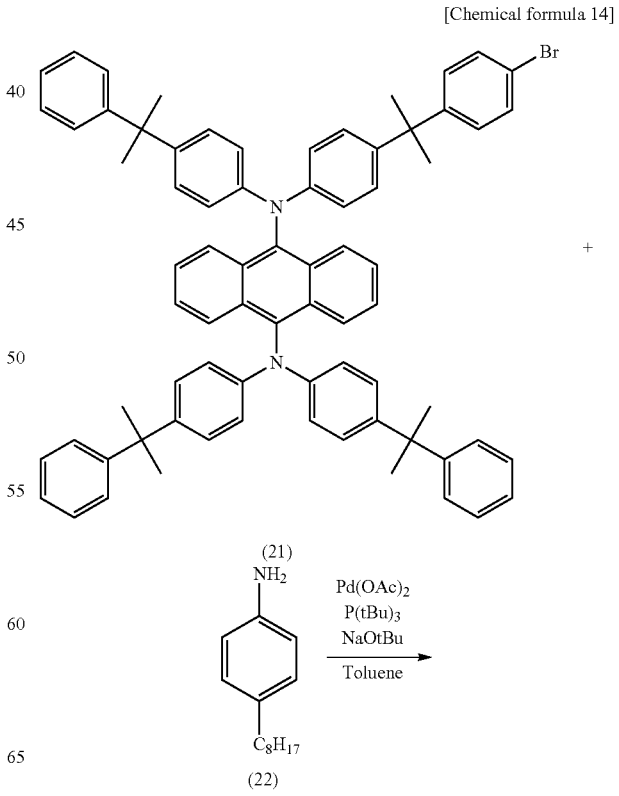

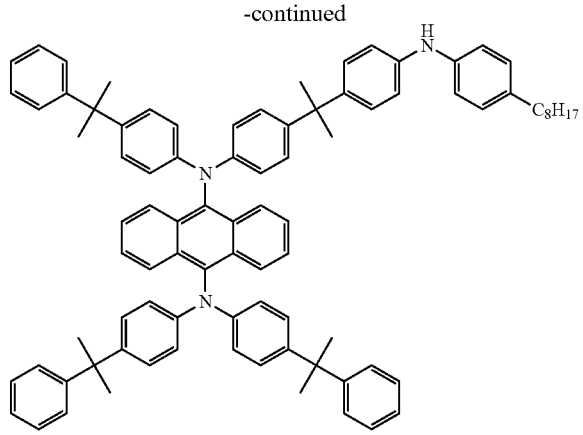

(23)

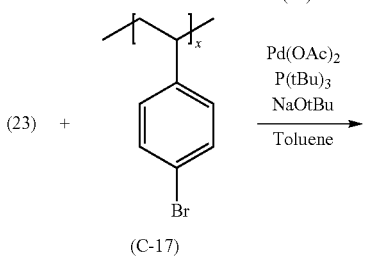

(23) +   (C-17)   →   Pd(OAc)₂  P(tBu)₃  NaOtBu  Toluene

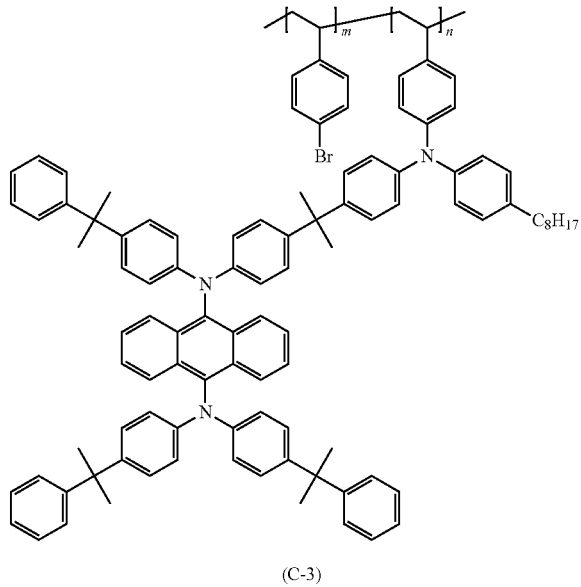

(C-3)

Example 3: m = 73, n = 27
Example 4: m = 80, n = 20

<Step 1> Synthesis of Compound (23)

In an argon atmosphere, 1.0 g ($9.4 \times 10^{-4}$ mol) of a compound (21), 0.5 g ($2.44 \times 10^{-3}$ mol) of 4-n-octylaniline (compound (22)), 0.14 g ($1.41 \times 10^{-3}$ mol) of sodium-t-butoxide and 27 ml of toluene were placed, to which a mixture of 2 mg (1 mol %) of palladium acetate and 10 mg of tri-t-butylphosphine dissolved in a small amount of toluene was added, followed by stirring at 100° C. for 3 hours. After cooled to room temperature, 20 cc of silica gel and sea sand were added thereto, the resultant was subjected to filtration with GFP. After solvent removal, column chromatography (toluene:n-hexane=1:1), solvent removal, dispersion washing with methanol, and drying at 80° C. for 1 hour, 0.8 g of a yellow solid was obtained. The obtained yellow solid was confirmed to be a compound (23) by NMR.

<Step 2> Synthesis of Polymeric Compound (C-3)

In an argon atmosphere, 0.8 g ($6.73 \times 10^{-4}$ mol) of the compound (23) obtained in Step 1, 0.37 g of a polymeric compound (C-17) (weight-average molecular weight: $7.18 \times 10^9$), 97 mg ($1.0 \times 10^{-3}$ mol) of sodium-t-butoxide and 20 ml of toluene were placed, to which a mixture of 1.5 mg (1 mol %) of palladium acetate and 10 mg of tri-t-butylphosphine dissolved in 0.5 ml of toluene was added, followed by stirring at 110° C. for 7 hours. After cooled to room temperature, the resultant was subjected to short column (toluene), solvent removal, dispersion washing with methanol, reprecipitation (THF/n-hexane), dispersion washing with methanol, and drying at 60° C. for 2 hours and at 135° C. for 1 hour. Thus, 0.99 g of a yellow solid was obtained. The obtained yellow solid was confirmed to be a polymeric compound (C-3) by NMR. The weight-average molecular weight thereof was determined by the gel permeation chromatography (GPC) method. The values of m and n were obtained by comparing the numbers of protons of the respective side chains in the NMR measurement. Moreover, a film was formed as in Example 1, and the fluorescent spectrum was measured. Table 1 shows the values of m and n as well as the evaluations of absorption and fluorescent properties of the film containing the polymeric compound.

Example 4

Synthesis of Polymeric Compound (C-3) (m=80, n=20)

A polymeric compound (C-3) was synthesized as in Example 3 except that the proportions of the reaction components were changed.

<Step 1> Synthesis of Compound (23)

In an argon atmosphere, 0.26 g ($2.44 \times 10^{-4}$ mol) of a compound (21), 0.15 g (excess) of 4-n-octylaniline (compound (22)), 35 mg ($3.66 \times 10^{-4}$ mol) of sodium-t-butoxide and 12 ml of toluene were placed, to which 1 mg (2 mol %) of palladium acetate and 10 mg of tri-t-butylphosphine were added, followed by stirring at 110° C. for 8 hours. After cooled to room temperature, a dilute hydrochloric acid solution was added thereto. The resultant was subjected to oil water separation, addition of sodium hydrogen carbonate, oil water separation, water washing, drying with sodium sulfate, solvent removal, column chromatography (toluene:n-hexane=1:1), solvent removal, and drying at 80° C. for 1 hour. Thus, 0.27 g of a yellow solid was obtained. The obtained yellow solid was confirmed to be a compound (23) by NMR.

<Step 2> Synthesis of Polymeric Compound (C-3)

In an argon atmosphere, 0.27 g ($2.27 \times 10^{-4}$ mol) of the compound (23) obtained in Step 1, 0.12 g of a polymeric compound (C-17) (weight-average molecular weight: $7.18 \times 10^4$), 32 mg ($3.41 \times 10^{-4}$ mol) of sodium-t-butoxide and 8 ml of toluene were placed, to which a mixture of 0.5 mg (1 mol %) of palladium acetate and 10 mg of tri-t-butylphosphine dissolved in a small amount of toluene was added, followed by stirring at 100° C. for 7 hours. After cooled to room temperature, the resultant was subjected to short column (toluene), solvent removal, dispersion washing with methanol, reprecipitation (THF/n-hexane), and drying at 60° C. for 2 hours. Thus, 0.18 g of a yellow solid was obtained. The obtained yellow solid was identified and the fluorescent spectrum thereof was measured as in Example 3. Table 1 shows the values of m and n as well as the evaluations of absorption and fluorescent properties of the film containing the polymeric compound.

Example 5

Synthesis of Polymeric Compound (C-5) (m=72, n=28)

A polymeric compound (C-5) was synthesized according to the following scheme.

[Chemical formula 15]

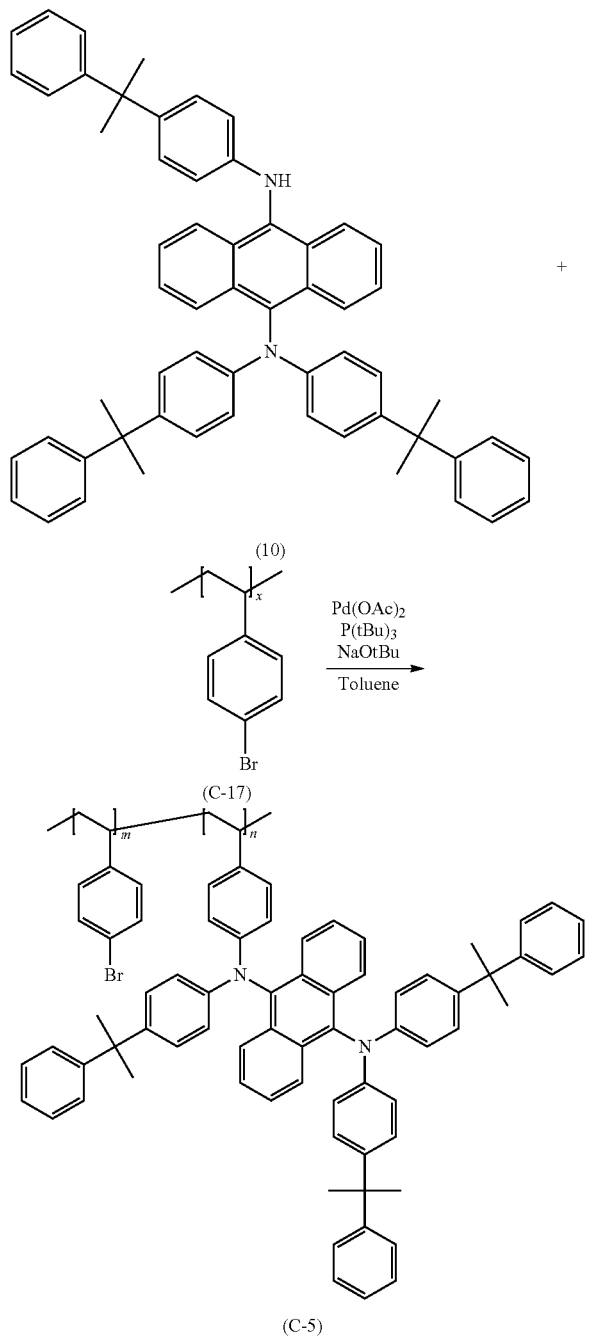

Example 5: m = 72, n = 28
Example 6: m = 84, n = 16
Example 7: m = 85, n = 15
Example 8: m = 69, n = 31

In an argon atmosphere, 1.0 g ($1.26 \times 10^{-3}$ mol) of a compound (10), 0.7 g of a polymeric compound (C-17) (weight-average molecular weight: $7.18 \times 10^4$), 0.2 g ($1.89 \times 10^{-3}$ mol) of sodium-t-butoxide and 10 ml of toluene were placed, to which mg (1 mol %) of palladium acetate and 10 mg of tri-t-butylphosphine were added, followed by stirring at 110° C. for 2 hours. After cooled to room temperature, the resultant was subjected to filtration with GFP, drying with sodium sulfate, solvent removal, dispersion washing with acetone, reprecipitation (THF/n-hexane), and drying at 120° C. for 1 hour. Thus, 0.6 g of a yellow solid was obtained. The obtained yellow solid was identified and the fluorescent spectrum thereof was measured as in Example 3.

Example 6

Synthesis of Polymeric Compound (C-5) (m=84, n=16)

In an argon atmosphere, 1.5 g ($1.90 \times 10^{-3}$ mol) of a compound (10), 1.4 g of a polymeric compound (C-17) (weight-average molecular weight: $7.18 \times 10^9$), 0.4 g ($3.8 \times 10^{-3}$ mol) of sodium-t-butoxide and 16 ml of toluene were placed, to which mg (1 mol %) of palladium acetate and 10 mg of tri-t-butylphosphine were added, followed by stirring at 100° C. for 7 hours. After cooled to room temperature, the resultant was subjected to short column (toluene), solvent removal, reprecipitation (THF/n-hexane), and drying at 80° C. for 2 hours. Thus, 0.6 g of a yellow solid was obtained. The obtained yellow solid was identified and the fluorescent spectrum thereof was measured as in Example 1. Table 1 shows the values of m and n as well as the evaluations of absorption and fluorescent properties of the film containing the polymeric compound.

Example 7

Synthesis of Polymeric Compound (C-5) (m=85, n=15)

After cooled to room temperature, a reaction solution obtained as in Example 6 was subjected to short column (toluene), solvent removal, reprecipitation (THF/methanol), dispersion washing in acetone, further dispersion washing in methanol, then reprecipitation (THF/n-hexane), dispersion washing with methanol, and drying at 80° C. for 2 hours. Thus, 1.0 g of a yellow solid was obtained. The obtained yellow solid was identified and the fluorescent spectrum thereof was measured as in Example 1. Table 1 shows the values of m and n as well as the evaluations of absorption and fluorescent properties of the film containing the polymeric compound.

Example 8

Synthesis of Polymeric Compound (C-5) (m=69, n=31)

In an argon atmosphere, 1.8 g ($2.27 \times 10^{-3}$ mol) of a compound (10), 0.8 g of a polymeric compound (C-19) (weight-average molecular weight: $7.18 \times 10^4$), 0.3 g ($2.72 \times 10^{-3}$ mol) of sodium-t-butoxide and 18 ml of toluene were placed, to which mg (1 mol %) of palladium acetate and 10 mg of tri-t-butylphosphine were added, followed by stirring at 100° C. for 7 hours. After cooled to room temperature, the resultant was subjected to short column (toluene), dispersion washing with acetone, reprecipitation (THF/n-hexane), dispersion washing with methanol, and drying at 80° C. for 2 hours. Thus, 2.0 g of a yellow solid was obtained. The obtained yellow solid was identified and the fluorescent spectrum thereof was measured as in Example 1. Table 1 shows the values of m and n as well as the evaluations of absorption and fluorescent properties of the film containing the polymeric compound.

TABLE 1

| Examples | Polymeric compounds | m | n | Weight-average molecular weight ($\times 10^5$) | $\lambda$ max (nm) | Fluorescence max (nm) |
|---|---|---|---|---|---|---|
| 1 | (C-1) | 89 | 11 | 2.81 | 472 | 548 |
| 2 | (C-2) | 86 | 14 | | 473 | 549 |
| 3 | (C-3) | 73 | 27 | 1.35 | 473 | 533 |
| 4 | (C-3) | 80 | 20 | 1.21 | 474 | 530 |
| 6 | (C-5) | 84 | 16 | 1.02 | 474 | 535 |
| 7 | (C-5) | 85 | 15 | 1.05 | 474 | 535 |
| 8 | (C-5) | 69 | 31 | 1.30 | 474 | 534 |

It can be seen from Table 1 that the compounds of the present invention are capable of absorbing a wavelength component corresponding to the absorption wavelength component and converting the wavelength component into light of a wavelength component corresponding to the fluorescence wavelength component, and are suitable for use as color conversion filters.

Example 9

Formation of Green Conversion Film

Figure 2:
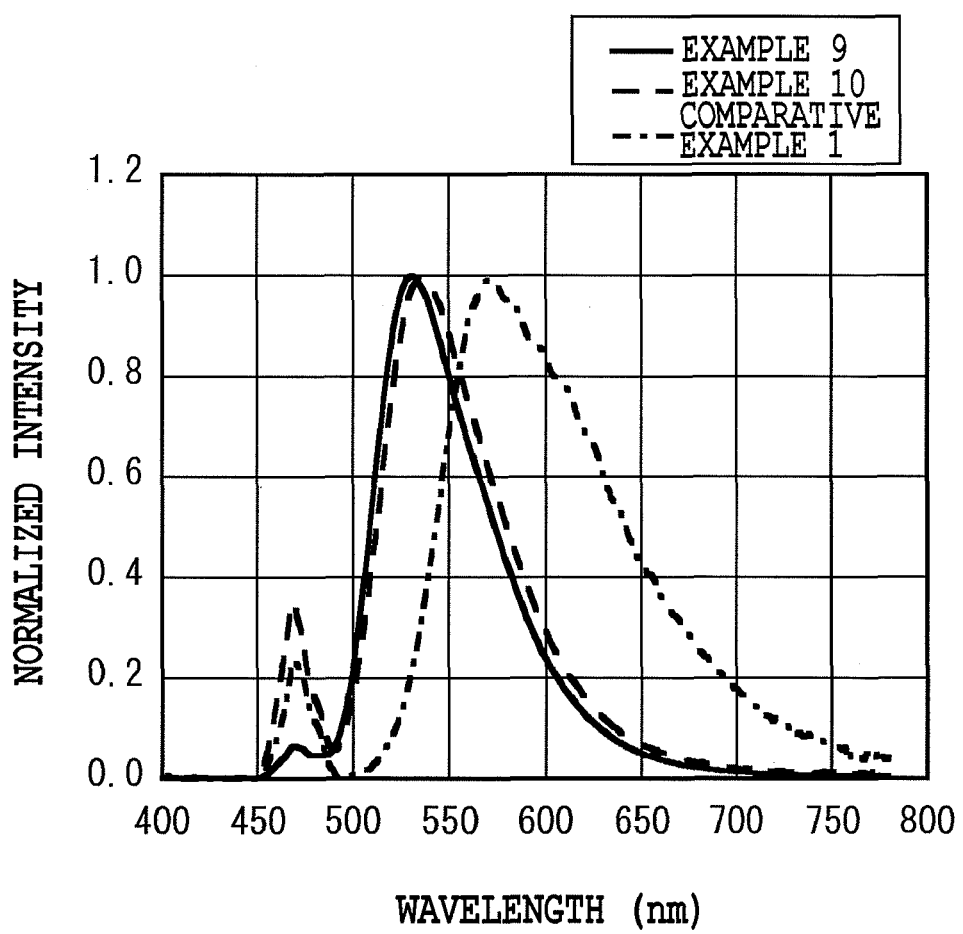
FIG. 2 is a graph showing PL spectra of films formed in Examples 9, 10, and Comparative Example 1.
Figure 4:
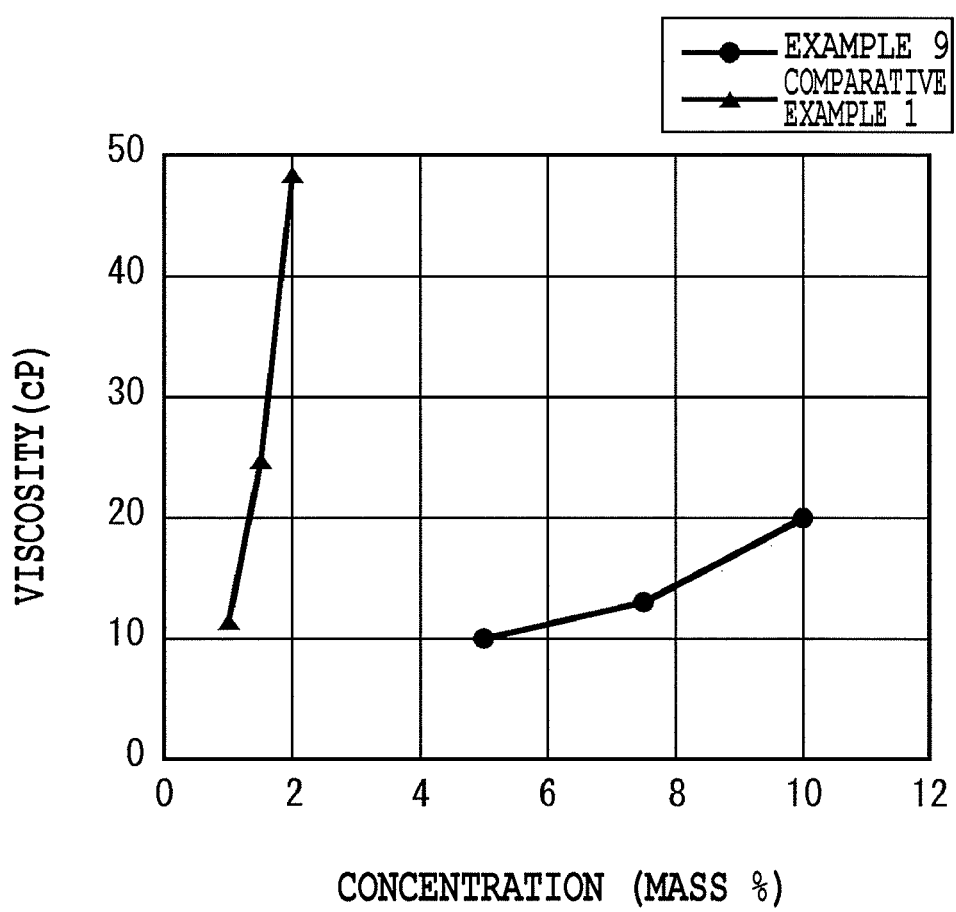
FIG. 4 is a graph showing a relationship between the viscosity and the concentration of solutions of color conversion materials used in Example 9 and Comparative Example 1.

As a transparent glass substrate, 50×50×0.7-mm 1737 glass manufactured by Corning Incorporated which had been washed with pure water and dried was used. A polymeric compound (C-5) (m=72, n=28) (polystyrene equivalent molecular weight determined using GPC method: 110,000) was dissolved in a THF solvent, so that the concentration reached 1% by weight. The glass substrate was set in a spin coater, and the pendant-type polymeric compound solution was added dropwise to form a uniform film thereon while the substrate was rotated. In this event, the substrate was rotated at a rotation speed of 800 rpm for 3 minutes. The fluorescence quantum yield of the obtained film was determined using an integrating sphere. Further, the photoluminescence (PL) spectrum of such films was measured. The excitation wavelength was 470 nm. Table 2 shows the fluorescence quantum yield of the obtained films. Moreover, FIG. 2 shows the PL spectrum of the obtained films. In addition, the correspondence between the viscosity and the concentration of the solution of the polymeric compound (C-5) used as the color conversion material was examined. For the viscosity measurement, a rotor-type viscometer was used. FIG. 4 shows the result.

Example 10

Formation of Green Conversion Film

A color conversion film was formed on a glass substrate by the same method as in Example 9 except that a polymeric compound (C-3) (m=80, n=20, polystyrene equivalent molecular weight determined using GPC method: 120,000) was used as a color conversion material. The fluorescence quantum yield of the obtained film was determined as in Example 9. Table 2 shows the result. Moreover, FIG. 2 shows the PL spectrum of the obtained film.

Comparative Example 1

Formation of Green Conversion Film

A color conversion film was formed on a glass substrate by the same method as in Example 1 except that a THF solution (concentration to by weight) of an arylene vinylene derivative MEH/PPV (polystyrene equivalent molecular weight determined using GPC method: 100,000) was used as a color conversion material. The fluorescence quantum yield of the obtained film was determined as in Example 9. Table 2 shows the result. Moreover, FIG. 2 shows the PL spectrum of the obtained film. In addition, FIG. 4 shows the result of examining the correspondence between the viscosity and the concentration of the solution of MEH/PPV used as the color conversion material.

Example 11

Formation of Red Conversion Film

Figure 3:
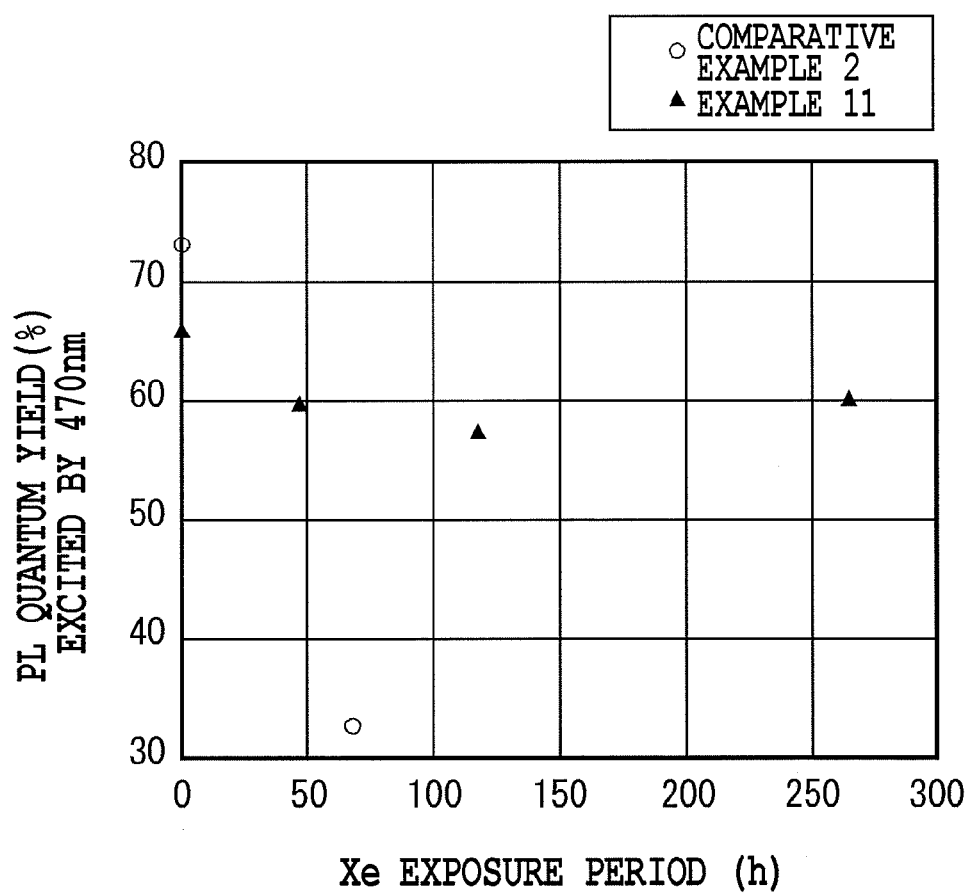
FIG. 3 is a graph showing the result of a light-fastness life test conducted on films formed in Example 11 and Comparative Example 2.

A color conversion film was formed on a glass substrate by the same method as in Example 9 except that a mixture of a THF solution of a polymeric compound (C-5) (concentration 1% by weight) and a THF solution of a low-molecular-weight red dye (concentration 0.1% by weight) was used. The fluorescence quantum yield of the obtained red conversion film was determined as in Example 9. Table 2 shows the result. Moreover, the obtained film was subjected to a light-fastness life test simulating sunlight irradiation. The substrate was heated to 60° C. and irradiated with light from a Xe lamp. This test corresponds to approximately 10 times acceleration in actual exposure to sunlight. FIG. 3 shows the result of the light-fastness life test.

Comparative Example 2

A host/guest color conversion film was formed on a glass substrate by the same method as in Example 11 except that MEH/PPV used in Comparative Example 1 was used in place of the polymeric compound (C-5) as a host material. The fluorescence quantum yield of the obtained film was determined as in Example 9. Table 2 shows the result. Moreover, FIG. 3 shows the result of the light-fastness life test conducted as in Example 11.

TABLE 2

| | Green conversion film | | | Red conversion film | |
|---|---|---|---|---|---|
| | Example 9 | Example 10 | Comparative Example 1 | Example 11 | Comparative Example 2 |
| Fluorescence quantum yield (%) | 61 | 45 | 40 | 65 | 72 |

It can be seen from Table 2 that as to the green conversion films, the highest fluorescence quantum yield was observed in Example 9, and that the fluorescence quantum yield in Comparative Example 1 was quite low. As to the red conversion films, a slightly higher fluorescence quantum yield was observed in Comparative Example 2 than in Example 11.

It can be seen from FIG. 2 that favorable green light emission was observed from the green conversion films in both of Examples 9 and 10; meanwhile, in Comparative Example 1, the shift to a longer wavelength was large, and the color of light emitted was close to orange. Note that, although not illustrated in FIG. 2, almost the same emission spectra were observed as to the red conversion films in Example 11 and Comparative Example 2. These had the emission spectra matched with those of the red guests, and the energy transfer between the host and the guest was confirmed.

It can be seen from FIG. 3 that as a result of the light-fastness life test, the fluorescence quantum yield was decreased rapidly, and the deterioration was recognized in Comparative Example 2; in contrast, in Example 11, the fluorescence quantum yield was slightly decreased at an initial stage of the test, but thereafter no progress in the deterioration was observed. In this manner, it was confirmed that use of the pendant-type polymeric compound of the present invention as a host enables formation of a long-lifetime red conversion film.

Further, as apparent from FIG. 4 showing the result of the viscosity measurement, it can be seen that, in comparison with the arylene vinylene derivative having an equivalent molecular weight, the pendant-type polymeric compound of the present invention had a very small increase in the viscosity as the concentration increased.

From the above, it was confirmed from the color conversion film of Example 1 which is within the scope of the present invention that a green-color conversion material having a sufficient color-conversion efficiency and capable of thin film formation by a coating process is obtained from a pendant-type polymeric compound in which an arylaminoanthracene derivative is introduced to a polymer chain of a polystyrene derivative. Further, it was confirmed that the use as a host material of a red conversion film enables formation of a long-lifetime red conversion film having a low tendency to deteriorate a low-molecular-weight guest. Moreover, it was confirmed that the concentration of ink is allowed to increase without significantly increasing the viscosity.

| Reference Signs List | |
|---|---|
| 10 | TRANSPARENT SUBSTRATE |
| 11 | SUBSTRATE |
| 20 | COLOR CONVERSION FILM |
| 30 | ORGANIC EL ELEMENT |
| 31 | TRANSPARENT ELECTRODE |
| 32 | ORGANIC EL LAYER |
| 33 | REFLECTIVE ELECTRODE |
| 40 | REFLECTIVE LAYER |

The invention claimed is:

1. A pendant-type polymeric compound characterized in that the pendant-type polymeric compound comprises:

at least one repeating unit represented by the following general formula (1) and at least one repeating unit represented by the following general formula (2), wherein n/(m+n)=1/100 to 100/100 provided that a molar ratio of (1):(2) is m:n

[Chemical formula 1]

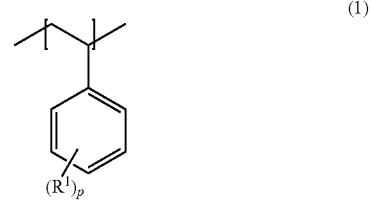

(1)

[Chemical formula 2]

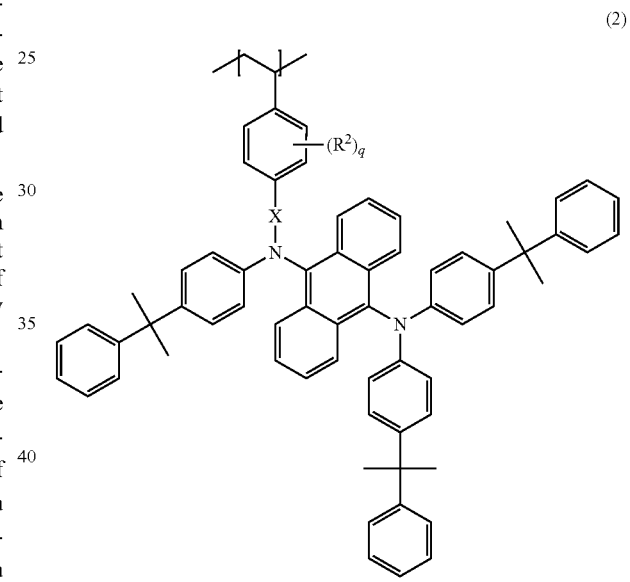

(2)

wherein $R^1$ and $R^2$ each independently represent a hydrogen atom, a hydroxyl group, an alkyl group having 1 to 10 carbon atoms which may have a substituent, an aryl group having 6 to 20 carbon atoms which may have a substituent, an arylalkyl group having 7 to 20 carbon atoms which may have a substituent, a heterocyclic group having 2 to 20 carbon atoms which may have a substituent, a (substituted) amino group, a halogen atom, a nitro group or a cyano group; X represents a direct bond or a linking group represented by any one of the following general formulas (3) to (5); p is a number of 1 to 5; q is a number of 1 to 4; a methylene group in the alkyl group having 1 to 10 carbon atoms or the arylalkyl group having 7 to 20 carbon atoms which may have a substituent represented by $R^1$ and $R^2$ may be interrupted by —O—, —S—, —CO—, —COO—, —OCO—, —SO$_2$—, —NH—, —NR'—, —CONH—, —NHCO—, —CONR'—, —NR'CO—, —N=CH— or —CH=CH—; and R' represents an alkyl group having 1 to 10 carbon atoms which may have a substituent, or an aryl group having 6 to 20 carbon atoms which may have a substituent

[Chemical formula 3]

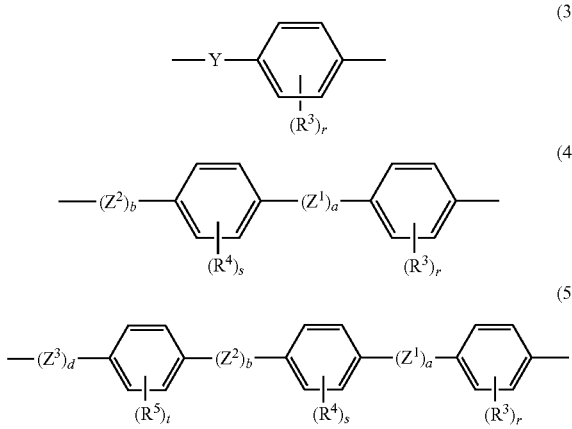

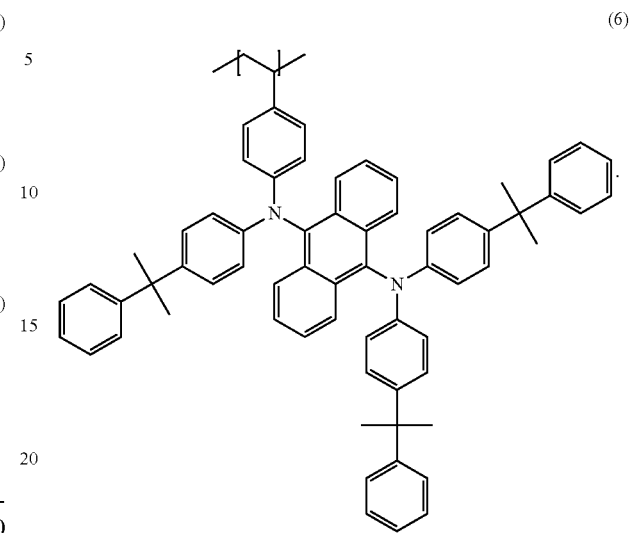

wherein $R^3$, $R^4$ and $R^5$ each independently represent a hydrogen atom, a hydroxyl group, an alkyl group having 1 to 10 carbon atoms which may have a substituent, an aryl group having 6 to 20 carbon atoms which may have a substituent, an arylalkyl group having 7 to 20 carbon atoms which may have a substituent, a heterocyclic group having 2 to 20 carbon atoms which may have a substituent, a (substituted) amino group, a halogen atom, a nitro group or a cyano group; Y represents a direct bond, —O—, —S—, —CO—, —COO—, —OCO—, —SO$_2$—, —NH—, —NR'—, —CONH—, —NHCO—, —CONR'—, —NR'CO—, —N=CH—, —CH=CH—, an alkylene group having 1 to 20 carbon atoms which may have a substituent, a cycloalkylene group having 6 to 20 carbon atoms which may have a substituent, a cycloalkenylene group having 6 to 20 carbon atoms which may have a substituent, or an arylene group having 6 to 20 carbon atoms which may have a substituent; $Z^1$, $Z^2$ and $Z^3$ each independently represent a direct bond, —O—, —S—, —CO—, —COO—, —OCO—, —SO$_2$—, —NH—, —NR'—, —CONH—, —NHCO—, —N=CH—, —CH=CH—, an alkylene group having 1 to 20 carbon atoms which may have a substituent, a cycloalkylene group having 6 to 20 carbon atoms which may have a substituent, a cycloalkenylene group having 6 to 20 carbon atoms which may have a substituent, or an arylene group having 6 to 20 carbon atoms which may have a substituent; r, s and t are each independently a number of 1 to 4; a, b and d are each independently a number of 0 or 1; a methylene group in the alkyl group having 1 to 10 carbon atoms and the arylalkyl group having 7 to 20 carbon atoms which may have a substituent represented by $R^3$, $R^4$ and $R^5$, and in the alkylene group having 1 to 20 carbon atoms represented by $Z^1$, $Z^2$ and $Z^3$ may be interrupted by —O—, —S—, —CO—, —COO—, —OCO—, —SO$_2$—, —NH—, —NR'—, —CONH—, —NHCO—, —CONR'—, —NR'CO—, —N=CH— or —CH=CH—; and R' is as defined in the general formulas (1) and (2).

2. The pendant-type polymeric compound according to claim 1, comprising:
at least one repeating unit represented by the general formula (1) and at least one repeating unit represented by the following general formula (6), wherein
n/(m+n)=1/100 to 100/100 provided that a molar ratio of (1):(6) is m:n 3. The pendant-type polymeric compound according to claim 1, comprising:
at least one repeating unit represented by the general formula (1) and at least one repeating unit represented by the following general formula (7), wherein
n/(m+n)=1/100 to 100/100 provided that a molar ratio of (1):(7) is m:n

[Chemical formula 5]

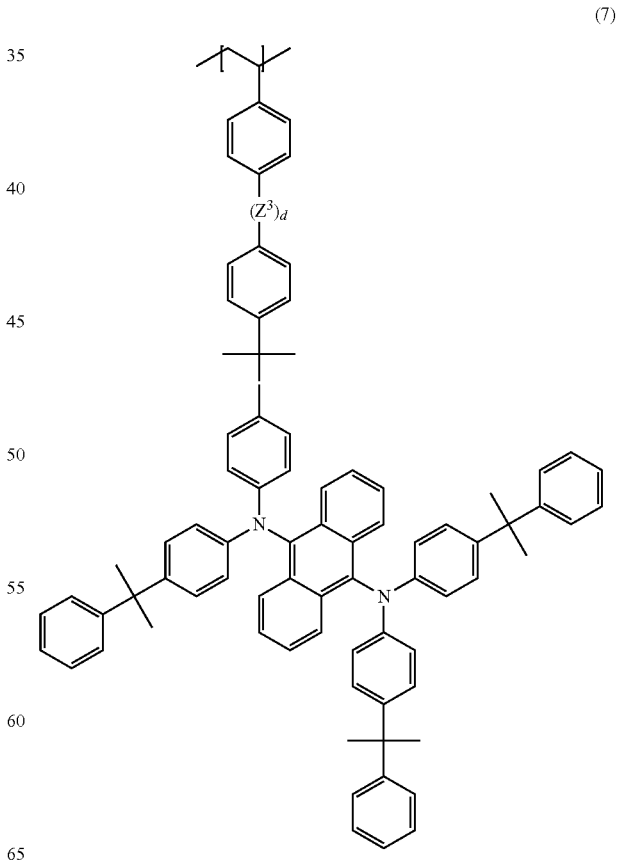

wherein $Z^3$ and d are as defined in the general formula (5).

4. A film comprising the pendant-type polymeric compound according to claim 1.

5. A color conversion film comprising the pendant-type polymeric compound according to claim 1.

6. A color conversion film characterized by comprising:
   the pendant-type polymeric compound according to claim 1; and
   a low-molecular-weight dye compound.

7. A color-converting light-emitting device characterized by comprising:
   an organic EL element; and
   the color conversion film according to claim 5.

* * * * *